US012645266B2

(12) United States Patent
Zigras et al.

(10) Patent No.: US 12,645,266 B2
(45) Date of Patent: Jun. 2, 2026

(54) CABLE ASSEMBLY FOR WEARABLE AUDIO DEVICES AND CORRESPONDING METHODS

(71) Applicant: Motorola Mobility LLC, Chicago, IL (US)

(72) Inventors: Ioannis A. Zigras, Chicago, IL (US); Ngee J Lee, Park Ridge, IL (US); Sang Yup Lee, Vernon Hills, IL (US)

(73) Assignee: Motorola Mobility LLC, Chicago, IL (US)

( * ) Notice: Subject to any disclaimer, the term of this patent is extended or adjusted under 35 U.S.C. 154(b) by 385 days.

(21) Appl. No.: 18/223,254

(22) Filed: Jul. 18, 2023

(65) Prior Publication Data

US 2024/0419222 A1     Dec. 19, 2024

(30) Foreign Application Priority Data

Jun. 15, 2023    (GR) .............................. 20230100484

(51) Int. Cl.
| *G06F 1/00* | (2006.01) |
| *G06F 1/16* | (2006.01) |
| *H05K 5/02* | (2006.01) |

(52) U.S. Cl.
CPC ............ *G06F 1/1683* (2013.01); *G06F 1/163* (2013.01); *H05K 5/0247* (2013.01)

(58) Field of Classification Search
CPC ...... G06F 1/1683; G06F 1/163; H05K 5/0247
See application file for complete search history.

(56) References Cited

U.S. PATENT DOCUMENTS

| 4,746,767 | A | * | 5/1988 | Gruhn ................ H01B 11/1016 |
| | | | | 174/109 |
| 6,091,832 | A | | 7/2000 | Shurman |
| 11,765,508 | B2 | | 9/2023 | Davis et al. |
| 2001/0050991 | A1 | | 12/2001 | Eves |
| 2003/0021433 | A1 | | 1/2003 | Lee |
| 2007/0084046 | A1 | * | 4/2007 | Stikeleather ......... H02G 3/0468 |
| | | | | 174/92 |
| 2008/0013778 | A1 | | 1/2008 | Lee |
| 2014/0160362 | A1 | | 6/2014 | Shintani |

(Continued)

FOREIGN PATENT DOCUMENTS

WO          2021005806          1/2021

OTHER PUBLICATIONS

Wen (CN 207958216U; published in 2018) (Year: 2018).*

(Continued)

*Primary Examiner* — Pete T Lee
(74) *Attorney, Agent, or Firm* — Philip H. Burrus, IV

(57)          ABSTRACT

A cable assembly for a wearable electronic device includes a pressure sensitive adhesive layer separating a first plurality of cables from a second plurality of cables with each cable of the first plurality of cables abutting a first major surface of the pressure sensitive adhesive layer and each cable of the second plurality of cables abutting a second major surface of the pressure sensitive adhesive layer. The cable assembly includes at least one wrap of conductive tape encircling the first plurality of cables, the second plurality of cables, and the pressure sensitive adhesive layer. The cable assembly includes a conductive tape layer positioned on an exterior surface of the at least one wrap of conductive tape.

21 Claims, 12 Drawing Sheets

(56) References Cited

U.S. PATENT DOCUMENTS

2017/0170918 A1    6/2017  Nicolino, Jr.
2018/0343534 A1   11/2018  Norris
2019/0227323 A1    7/2019  Sendai
2021/0233378 A1*   7/2021  Murati ................. G08B 21/245

OTHER PUBLICATIONS

Mizuno et al. (WO 2020121433 A1; hereinafter Mizuno). (Year: 2020).*
Ross et al. (CN 100365739) (Year: 2005).*
Huang (CN203826052; published in 2014) (Year: 2014).*
Yamaguchi et al. (WO 2019044122 A1) (Year: 2019).*
"JBL Soundgear—Internal Device Pictures", Pictures taken by inventors of present application—U.S. Appl. No. 17/505,514; Taken prior to filing of present application.
"JBL Soundgear BTA Wearable Neck Speaker", Unknown Publication Date; Viewed online at https://www.ebay.com/itm/224673745985?chn=ps&_trkparms=ispr%3D...0602&merchantid=51291&msclkid=d293adc019a71c7157f7cf57eb8fbbb3.
"Speaker System Sound Processing Device, Sound Processing Methods and Program,", English Translation of WO2021/005806; Jan. 14, 2021.
Mohammad, Assad , "Non-Final Office Action", U.S. Appl. No. 17/505,524, filed Oct. 19, 2021; Mailed May 22, 2023.

* cited by examiner

ORIGINAL
STEREO
IMAGE

PERCEIVED
STEREO
IMAGE
PULLED
FORWARD
BY
ANTERIOR
PENDANT

701

806

600

702

704

707

703

1101

1102

1103

1104

1200

CABLE ASSEMBLY FOR WEARABLE AUDIO DEVICES AND CORRESPONDING METHODS

CROSS REFERENCE TO PRIOR APPLICATIONS

This application claims priority and benefit under 35 U.S.C. § 119 from Greek Patent Application No. 20230100484, filed Jun. 15, 2023, which is incorporated by reference by rule in accordance with 37 CFR § 1.57.

BACKGROUND

Technical Field

This disclosure relates generally to wearable electronic devices, and more particularly to wearable electronic devices with components electrically coupled together by cables.

Background Art

Portable electronic devices, such as smartphones, tablet computers, and wearable electronic devices, are becoming ubiquitous in modern society. Many people today own a smart phone or other wireless communication device with which they communicate with friends, workers, and family, manage calendars, purchase goods and services, listen to music, watch videos, play games, and surf the Internet.

A challenge presented to designers of such devices stems from the human form and the challenges associated with getting information from an electronic device to the user. For instance, while many of the features of a smartphone can be integrated into a smart watch, a user must still move their arm toward their face to see the display of the smart watch or move their arm toward their ear to listen to audio from its outputs. Similarly, while augmented reality displays can be integrated into eyeglasses, such displays may be too small to render sufficient data.

For devices worn around the wrist or neck, it can be challenging to create comfortable, discreet, human form conforming connections between electronic components. It would be advantageous to have improved coupling components for a wearable electronic device that allows for robust performance while still maintaining a pleasant form factor.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present disclosure.

Figure 1:
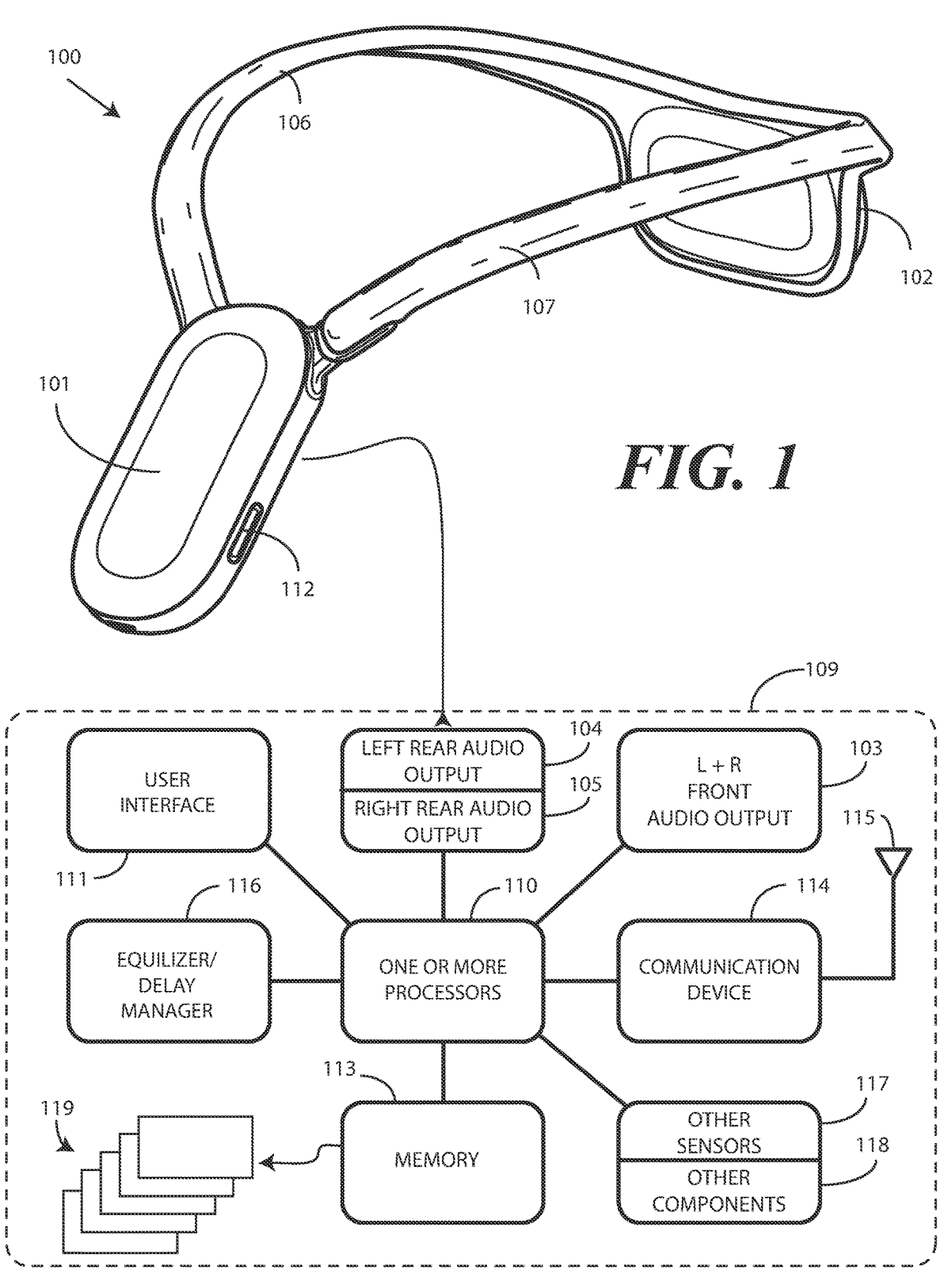
FIG. 1 illustrates one explanatory wearable electronic device in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to a cable assembly for a wearable electronic device. Alternate implementations are included, and it will be clear that functions may be executed out of order from that shown or discussed, including substantially concurrently or in reverse order, depending on the functionality involved.

Accordingly, the apparatus components and method steps have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ASICs with minimal experimentation.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

As used herein, components may be "operatively coupled" when information can be sent between such components, even though there may be one or more intermediate or intervening components between, or along the connection path. The terms "substantially," "essentially," "approximately," "about," or any other version thereof, are defined as being close to as understood by one of ordinary skill in the art, and in one non-limiting embodiment the term is defined to be within ten percent, in another embodiment within five percent, in another embodiment within one percent and in another embodiment within one-half percent. The term "coupled" as used herein is defined as connected, although not necessarily directly and not necessarily mechanically. Also, reference designators shown herein in parenthesis indicate components shown in a figure other than the one in discussion. For example, talking about a device (10) while discussing figure A would refer to an element, 10, shown in figure other than figure A.

Embodiments of the disclosure are directed to a cable assembly for a wearable electronic device. In one or more embodiments, the cable assembly comprises a pressure sensitive adhesive layer separating a first plurality of cables from a second plurality of cables. In one or more embodiments, each cable of the first plurality of cables abuts a first major surface of the pressure sensitive adhesive layer, while each cable of the second plurality of cables abuts a second major surface of the pressure sensitive adhesive layer.

In one or more embodiments, at least one wrap of conductive tape encircles the first plurality of cables, the second plurality of cables, and the pressure sensitive adhesive layer. In one or more embodiments, a conductive tape layer is positioned on an exterior surface of the at least one wrap of insulating tape.

In one or more embodiments, a cushion layer is positioned on the exterior surface of the at least one wrap of conductive tape. In one or more embodiments, the cushion layer and the conductive tape layer are positioned on opposite sides of the at least one wrap of conductive tape. In one or more embodiments, major axes of the conductive tape layer and the cushion layer are substantially parallel.

In one or more embodiments, the at least one wrap of conductive tape comprises a plurality of wraps of conductive tape. Each wrap of conductive tape is separated from at least one other wrap of the conductive tape by a predefined distance.

In one or more embodiments, the conductive tape layer comprises a wrap of Teflon tape. In one or more embodiments, the conductive tape layer comprises a double-sided adhesive layer of conductive tape.

In one or more embodiments, each cable of the first plurality of cables has a smaller diameter than each cable of the second plurality of cables. In one or more embodiments, some cables of the second plurality of cables have different diameters than some other cables of the second plurality of cables.

In one or more embodiments, a fabric sheath envelops the cable assembly. In one or more embodiments, a cable assembly carrier is situated between the cable assembly and the fabric sheath. In one or more embodiments, the cable assembly carrier comprises a thermoplastic elastomer.

Embodiments of the disclosure can be used in a wearable electronic device. Illustrating by example, in one or more embodiments the cable assembly is used with a wearable acoustic device such that the cable assembly serves as a connector between an anterior pendant and a posterior pendant. The anterior pendant and posterior pendant, working in tandem, can deliver an acoustic stereo image to the ears of a user. While such a wearable electronic device will be used below as an illustrative example, it will be clear to those of ordinary skill in the art having the benefit of this disclosure that cable assemblies configured in accordance with embodiments of the disclosure can be used with other wearable electronic devices as well.

To provide some background regarding the wearable electronic device that will be used as an illustrative example below for cable assemblies configured in accordance with embodiments of the disclosure, note that in prior art wearable audio output electronic devices the only way to achieve the delivery of a reasonable stereo image presentation to a user is to place loudspeakers directly beneath the ears of the wearer. Using a wearable electronic device that effectively looks like an inflatable neck pillow one would wear while trying to sleep on an airplane, a left channel loudspeaker can be placed directly beneath the user's left ear while a right channel loudspeaker is placed directly beneath the user's right ear. While such a configuration provides a reasonable stereo image to the user, the form factor is bulky, looks awkward, and can make the user self-conscious when wearing the device. What's more, when the user slightly tilts their head, any stereo image that is delivered to the user can quickly collapse to one side or the other.

In the illustrative wearable electronic device with which cable assemblies configured in accordance with embodiments of the disclosure are used below, an innovative and unique solution to this problem is provided by a sleek, slim, and stylish wearable electronic device that includes an anterior pendant and a posterior pendant that are connected one or more cable assemblies that serve as minimalist neck straps. Embodiments of the disclosure contemplate that it is not always practical—especially when trying to design a stylish and fashionable electronic device—to place loudspeakers beneath the ears of a wearer. While speakers placed behind the ears can provide adequate sound quality and stereo image, this placement is suboptimal since the stereo image sounds like it is behind the user. People like to listen to immersive music or music that they can see. They typically do not prefer to listen to posterior music sources.

Similarly, placing stereo audio output devices in front of a wearer generally fails to provide a robust stereo image, as noted above. This is true because there is not enough physical separation between the audio output devices relative to the ears to separate the left and right channels.

Cable assemblies configured in accordance with embodiments of the disclosure are used to couple an anterior pendant to a posterior pendant. By positioning a single loudspeaker in an anterior pendant that provides a monaural audio signal output combining a left channel audio signal output and a right channel audio signal output, while simultaneously providing a left channel audio signal output and a right channel audio signal output from a posterior pendant, the combined stereo image from the posterior pendant is "pulled" toward the anterior pendant to a central location within the wearable electronic device situated at locations corresponding to a wearer's ears. In comparison to providing audio output from an anterior pendant alone or providing audio output from a posterior pendant alone, using a posterior pendant to deliver separate left and right channel audio, while using an anterior pendant to deliver a combined left and right channel audio output allows the stereo image defined by the combination of these three outputs to provide a rich, enveloping stereo image that sounds as if located right at the user's ears.

Accordingly, in one or more embodiments a wearable electronic device comprises an anterior pendant comprising a single channel anterior audio output delivering a combined left channel audio signal and right channel audio signal through a port of the anterior pendant. The wearable electronic device includes a posterior pendant comprising a first single channel posterior audio output delivering a left channel audio signal through a first port of the posterior pendant and a second single channel posterior audio output delivering the right channel audio signal through a second port of the posterior pendant. By delivering the combined right channel audio signal and left channel audio signal from the anterior pendant, the stereo image created by the audio outputs of the posterior pendant is pulled forward from behind a user to a location corresponding to the user's ears.

In one or more embodiments, at least one cable assembly couples the anterior pendant to the posterior pendant. Given that data, power, and other electrical signals need to pass through the cable assembly, many different cables must pass through the cable assembly. Embodiments of the disclosure contemplate that it is difficult to construct cable assemblies that accommodate such disparate cable configurations in a discreet, quiet, bendable, and comfortable strap. Embodiments of the disclosure deliver such a cable assembly, however, that conforms to the human body in a discreet manner with the cable assembly having a thin, ovular cross section in one or more embodiments. The cable assembly is therefore thin and discreet. In addition, the cable assembly is advantageously waterproof, flexible, quiet, and doesn't shift along a person's skin.

Other advantages offered by embodiments of the disclosure will be described below. Still others will be obvious to those of ordinary skill in the art having the benefit of this disclosure.

Turning now to FIG. 1, illustrated therein is one explanatory wearable electronic device 100 configured in accordance with one or more embodiments of the disclosure. In one or more embodiments, the wearable electronic device 100 comprises an anterior pendant 101 and a posterior pendant 102. In one or more embodiments, the anterior pendant 101 comprises a single channel anterior audio output 103 delivering a combined left channel audio signal and right channel audio signal through a port of the anterior pendant 101. The posterior pendant 102 comprises a first single channel posterior audio output 104 delivering the left channel audio signal through a first port of the posterior pendant 102 and a second single channel posterior audio output 105 delivering the right channel audio signal through a second port of the posterior pendant 102. The combination of the combined left channel audio signal and right channel audio signal from the anterior pendant 101 and the separated left channel audio signal and right channel audio signal from the posterior pendant 102 pull a perceived stereo image toward the anterior pendant 101 to a centralized location within the wearable electronic device 100.

In one or more embodiments, a first neck strap 106 couples a first side of the anterior pendant 101 to a first side of the posterior pendant 102. In one or more embodiments, a second neck strap 107 couples a second side of the anterior pendant 101 to a second side of the posterior pendant 102.

In one or more embodiments, at least one of the first neck strap 106 and/or the second neck strap 107 comprises a wrapped cable structure comprising a pressure sensitive adhesive layer separating a first plurality of cables from a second plurality of cables with each cable of the first plurality of cables abutting a first major surface of the pressure sensitive adhesive layer and each cable of the second plurality of cables abutting a second major surface of the pressure sensitive adhesive layer. In one or more embodiments, at least one wrap of conductive tape encircles the first plurality of cables, the second plurality of cables, and the pressure sensitive adhesive layer. In one or more embodiments, a conductive tape layer is positioned on an exterior surface of the at least one wrap of conductive tape.

In one or more embodiments, a cushion layer is positioned on the exterior surface of the at least one wrap of conductive tape. A fabric layer enshrouds the wrapped cable structure. A cable assembly carrier is situated between the cable assembly and the fabric layer. In one or more embodiments, the conductive tape layer comprises a double-sided adhesive tape coupling the wrapped cable structure to the cable assembly carrier. In one or more embodiments, the cushion layer abuts an interior surface of the fabric layer.

In one or more embodiments, the first plurality of cables and the second plurality of cables are each arranged in a row such that the first plurality of cables and the second plurality of cables define a two-row assembly to provide a thin and narrow bundled cable. Moreover, this side-by-side arrangement of each cable in the first plurality of cables and the second plurality of cables allows the resulting cable assembly to have a curved shape that is maintained despite the cable assembly being bent by a user.

Embodiments of the disclosure contemplate that wearable products such as the wearable electronic device 100 of FIG. 1 should have some level of water resistance to prevent sweat or water from damaging the product. In one or more embodiments, the fabric layer is hydrophobic so water cannot enter through the flexible substrate from directions oriented orthogonally relative to the outer surface of the fabric layer. In one or more embodiments, the cable assembly is then secured to the anterior pendant 101 and posterior pendant 102 so that water cannot enter either pendant to damage the electrical connections therein.

In one or more embodiments, each of the anterior pendant 101 and the posterior pendant 102 includes a housing, while the first neck strap 106 and the second neck strap 107 serve both as a right shoulder strap and left shoulder strap that allow the wearable electronic device 100 to be worn around the neck as well as to provide a conduit for electrical connections passing from the anterior pendant 101 to the posterior pendant 102 or vice versa. While the anterior pendant 101 and posterior pendant 102 can be configured as shown in FIG. 1, other configurations for each housing and/or shoulder strap and/or other mechanical configurations of wearable electronic devices will be obvious to those of ordinary skill in the art having the benefit of this disclosure.

Also illustrated in FIG. 1 is one explanatory block diagram schematic 109 of the wearable electronic device 100. In one or more embodiments, the block diagram schematic 109 can be constructed as multiple printed circuit board assemblies situated within either the housing of the anterior pendant 101, the housing of the posterior pendant 102, the first neck strap 106, the second neck strap 107, or combinations thereof. Where one or more circuit boards are used, the various components can be electrically coupled together by the various cable passing through the cable assemblies defining one or both of the first neck strap 106 and/or the second neck strap 107. It should be noted that the block diagram schematic 109 includes many components that are optional, but which are included in an effort to demonstrate how varied electronic devices configured in accordance with embodiments of the disclosure can be.

Illustrating by example, in one or more embodiments the wearable electronic device 100 includes a user interface 111. The user interface 111 can include an audio input device, such as a microphone, to receive audio input. The user interface 111 also includes a plurality of audio output devices to deliver audio output, which in this illustrative embodiment include the single channel anterior audio output 103 of the anterior pendant 101 and the first single channel posterior audio output 104 of the posterior pendant 102 and the second single channel posterior audio output 105 of the posterior pendant 102. Each of the single channel anterior audio output 103 of the anterior pendant 101, the first single channel posterior audio output 104 of the posterior pendant 102, and the second single channel posterior audio output 105 of the posterior pendant 102 can consist of a single loudspeaker in one or more embodiments. However, in other embodiments, multiple loudspeakers can be clustered to form each of the single channel anterior audio output 103 of the anterior pendant 101, the first single channel posterior audio output 104 of the posterior pendant 102, and the second single channel posterior audio output 105 of the posterior pendant 102 as well.

In one or more embodiments, the user interface 111 includes a display, which can optionally be configured to be touch sensitive. Where the wearable electronic device 100 is configured to be a companion electronic device to another electronic device, such as a smartphone, with its companion functionality being that of purely an audio output device, a display would be optional, in it is not required for this aural user interaction convention.

Thus, it is to be understood that the block diagram schematic 109 of FIG. 1 is provided for illustrative purposes only and for illustrating components of one wearable electronic device 100 in accordance with embodiments of the disclosure. The block diagram schematic 109 of FIG. 1 is not intended to be a complete schematic diagram of the various components required for a wearable electronic device 100. Therefore, other electronic devices in accordance with embodiments of the disclosure may include various other components not shown in FIG. 1 or may include a combination of two or more components or a division of a particular component into two or more separate components, and still be within the scope of the present disclosure.

The illustrative block diagram schematic 109 of FIG. 1 includes many different components. Embodiments of the disclosure contemplate that the number and arrangement of such components can change depending on the particular application. For example, a wearable electronic device that only includes at least one audio output with no audio input may have fewer, or different, components from a wearable electronic device having both user interface components. Similarly, a wearable electronic device that includes at least one audio output in addition to at least one audio input can include multiple audio inputs, one example of which would be a microphone array. Accordingly, electronic devices configured in accordance with embodiments of the disclosure can include some components that are not shown in FIG. 1, and other components that are shown may not be needed and can therefore be omitted.

As noted above, the user interface 111 can include a display, which may optionally be touch-sensitive. In one embodiment, users can deliver user input to the display of such an embodiment by delivering touch input from a finger, stylus, or other objects disposed proximately with the display. In one embodiment, the display is configured as an active-matrix organic light emitting diode (AMOLED) display. However, it should be noted that other types of displays, including liquid crystal displays, suitable for use with the user interface would be obvious to those of ordinary skill in the art having the benefit of this disclosure. Where a display is omitted, a user interface component 112, such as a button, switch, touch sensitive surface, or other control mechanism can allow a user to operate the wearable electronic device 100.

In one embodiment, the wearable electronic device 100 includes one or more processors 110. In one embodiment, the one or more processors 110 can include an application processor and, optionally, one or more auxiliary processors. One or both of the application processor and/or the auxiliary processor(s) can include one or more processors. One or both of the application processor and/or the auxiliary processor(s) can be a microprocessor, a group of processing components, one or more ASICs, programmable logic, or other type of processing device.

The application processor and/or the auxiliary processor(s) can be operable with the various components of the block diagram schematic 109. Each of the application processor and/or the auxiliary processor(s) can be configured to process and execute executable software code to perform the various functions of the wearable electronic device 100 with which the block diagram schematic 109 operates. A storage device, such as memory 113, can optionally store the executable software code used by the one or more processors 110 during operation.

In this illustrative embodiment, the block diagram schematic 109 also includes a communication circuit 114 that can be configured for wired or wireless communication with one or more other devices or networks. The networks can include a wide area network, a local area network, and/or personal area network. The communication circuit 114 may also utilize wireless technology for communication, such as, but are not limited to, peer-to-peer or ad hoc communications such as HomeRF, Bluetooth and IEEE 802.11-based communications, as well as other forms of wireless communication such as infrared technology. The communication circuit 114 can include wireless communication circuitry, one of a receiver, a transmitter, or transceiver, and one or more antennas 115.

In one embodiment, the one or more processors 110 can be responsible for performing the primary functions of the electronic device with which the block diagram schematic 109 is operational. For example, in one embodiment the one or more processors 110 comprise one or more circuits operable with the user interface 111 to deliver audio output signals in the form of acoustic waves to a user. The source data for generating these acoustic waves could be stored in the memory 113, or alternatively may be received from an external electronic device using the communication circuit 114. The one or more processors 110 can be operable with an audio output device to deliver audio output to a user. The executable software code used by the one or more processors 110 can be configured as one or more modules 119 that are operable with the one or more processors 110. Such modules 119 can store instructions, control algorithms, media content, digital to analog conversion algorithms, sound generation algorithms, and so forth.

In one or more embodiments, the one or more processors 110 operate with, or as, an audio input/processor. The audio input/processor is operable to receive audio input from a source, such as a person, authorized user, plurality of persons within an environment about the wearable electronic device 100, from the environment about the wearable electronic device 100, or combinations thereof. The audio input/processor can include hardware, executable code, and speech monitor executable code in one embodiment. The audio input/processor can be operable with one or both of an audio input device, such as one or more microphones, and/or the audio output devices, each of which can comprise one, or more than one, loudspeaker as previously described.

In one embodiment, the audio input/processor is configured to implement a voice control feature that allows the wearable electronic device 100 to function as a voice assistant device, which is a digital assistant using voice recognition, speech synthesis, and natural language processing to receive audio input comprising a voice command from a source, determine the appropriate response to the voice command, and then deliver the response in the form of audio output in response to receiving the audio input from the source.

Various sensors 117 can be operable with the one or more processors 110. A first example of a sensor that can be included with the various sensors 117 is a touch sensor. The touch sensor can include a capacitive touch sensor, an infrared touch sensor, resistive touch sensors, or another touch-sensitive technology that serves as a user interface 111 for the wearable electronic device 100.

Another example of a sensor 117 is a geo-locator that serves as a location detector. Location of the wearable electronic device 100 can be determined by capturing the location data from a constellation of one or more earth orbiting satellites, or from a network of terrestrial base stations to determine an approximate location.

One or more motion detectors can be configured as an orientation detector that determines an orientation and/or movement of the wearable electronic device 100 in three-dimensional space. Illustrating by example, the orientation detector can include an accelerometer, a multi-axis accelerometer, gyroscopes, or other device to detect device orientation and/or motion of the wearable electronic device 100. Other sensors 117 suitable for inclusion with the wearable electronic device 100 will be obvious to those of ordinary skill in the art having the benefit of this disclosure.

Other components 118 operable with the one or more processors 110 can include output components such as video, audio, and/or mechanical outputs. For example, the output components may include a video output component or auxiliary devices including a cathode ray tube, liquid crystal display, plasma display, incandescent light, fluorescent light, front or rear projection display, and light emitting diode indicator. Other examples of output components include audio output components such as the one or more loudspeakers used for the single channel anterior audio output 103 of the anterior pendant 101, the first single channel posterior audio output 104 of the posterior pendant 102, and the second single channel posterior audio output 105 of the posterior pendant 102, or other alarms and/or buzzers. The other components 118 can also include a mechanical output component such as vibrating or motion-based mechanisms.

In one or more embodiments, the one or more processors 110 can define one or more process engines. One example of such a process engine is the equalizer/delay manager 116. In one or more embodiments, the equalizer/delay manager 116 is operable to insert a predefined delay between the combined left channel audio signal and right channel audio signal emanating from the single channel anterior audio output 103 of the anterior pendant 101 and each of the left channel audio signal emanating from the first single channel posterior audio output 104 of the posterior pendant 102 and the right channel audio signal emanating from second single channel posterior audio output 105 of the posterior pendant. This predefined delay ensures that audio signals from the posterior pendant 102, which are closer to the user's ears, arrive at the user's ears at the same time or after as those from the anterior pendant 101, which is farther away. In one or more embodiments, the equalizer/delay manager 116 can also adjust the relative volume levels of sound emanating the combined left channel audio signal and right channel audio signal emanating from the single channel anterior audio output 103 of the anterior pendant 101 and each of the left channel audio signal emanating from the first single channel posterior audio output 104 of the posterior pendant 102 and the right channel audio signal emanating from second single channel posterior audio output 105 of the posterior pendant to affect the overall user experience as well.

Figure 4:
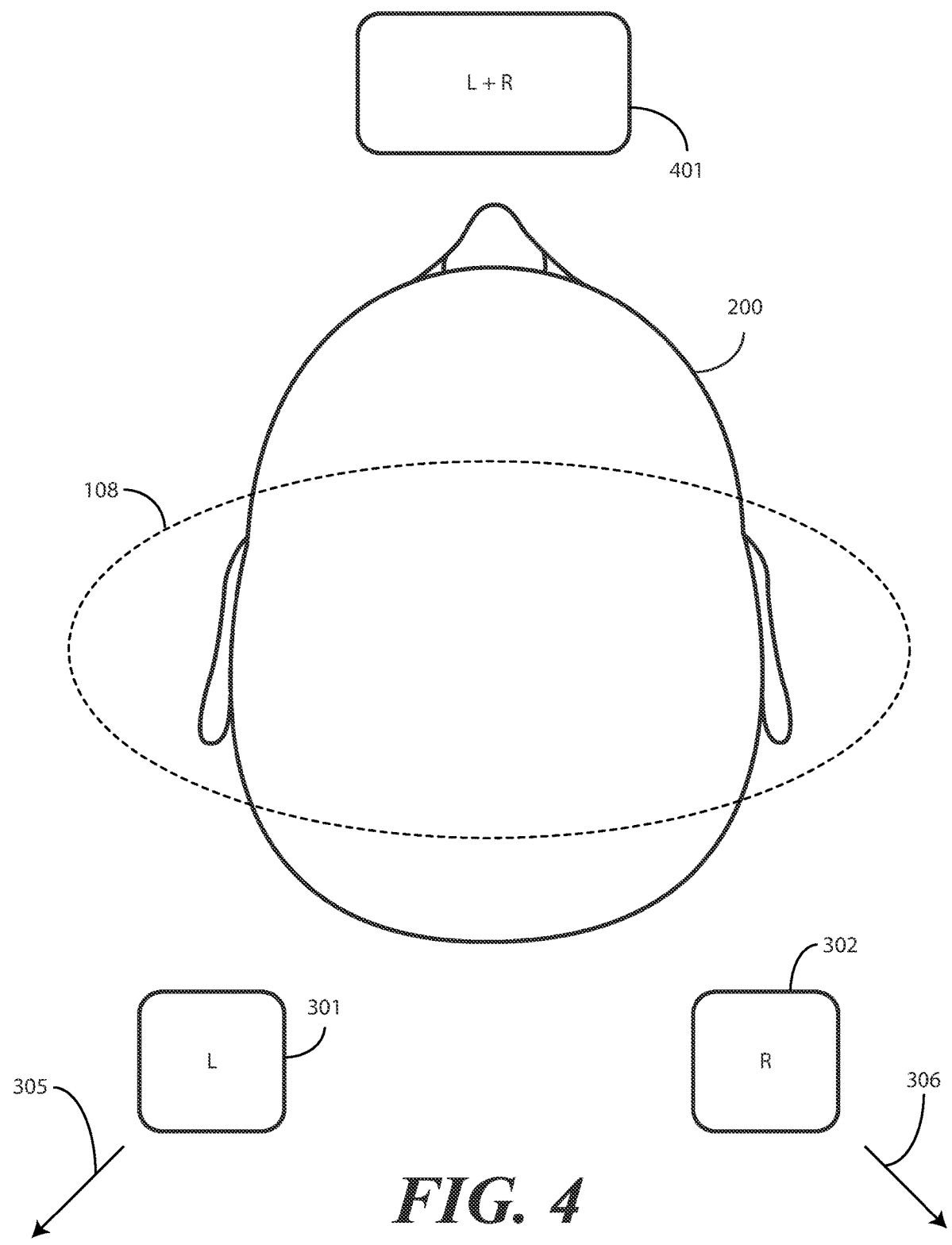
FIG. 4 illustrates a simplified schematic block diagram of one explanatory audio output arrangement for a wearable electronic device in accordance with one or more embodiments of the disclosure.
Figure 5:
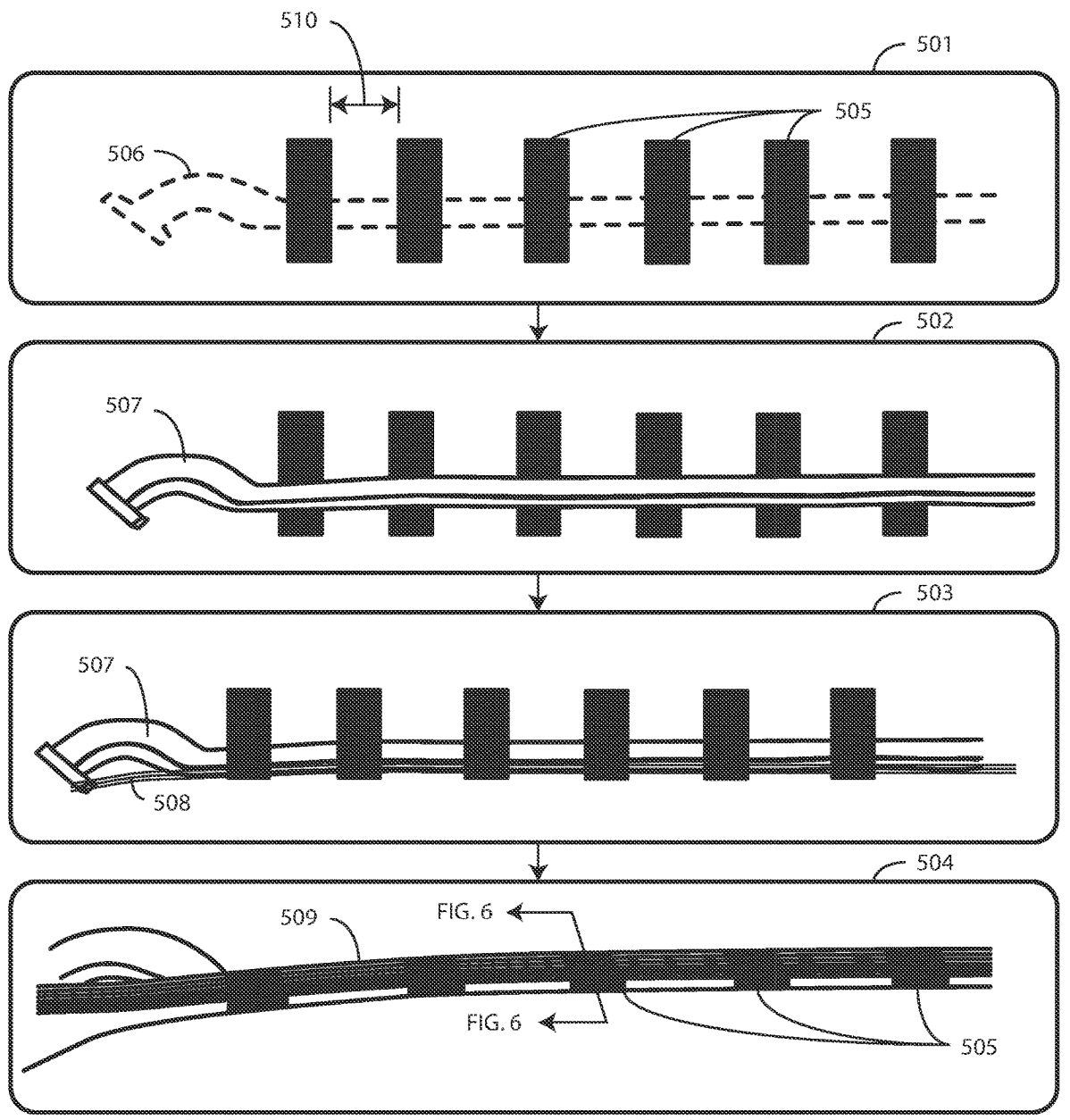
FIG. 5 illustrates one explanatory method for manufacturing a cable assembly in accordance with one or more embodiments of the disclosure.

In one or more embodiments, the predefined delay is less than three milliseconds. In one or more embodiments, the predefined delay is about one millisecond. These examples are based upon the speed of sound when the wearable electronic device 100 is worn as shown in FIGS. 4 and 5 below, with the anterior pendant 101 and posterior pendant 102 positioned in the corresponding relationship to the user's ears.

In one or more embodiments, the predefined delay is user definable. Illustrating by example, in one or more embodiments a user can use the user interface 111 to define the predefined delay to adjust the location of the stereo image 108 within the perimeter of the wearable electronic device 100. Illustrating by example, embodiments of the disclosure contemplate that a user may want to adjust the stereo image 108 such that it situates slightly in front of the ears, at the ears, or slightly behind the ears. By making the predefined delay and/or relative volume level user adjustable, any of these locations becomes possible.

Each process engine can be a component of the one or more processors 110, operable with the one or more processors 110, defined by the one or more processors 110, and/or integrated into the one or more processors 110. Other configurations for these process engines, including as software or firmware modules operable on the one or more processors 110, will be obvious to those of ordinary skill in the art having the benefit of this disclosure.

Figure 2:
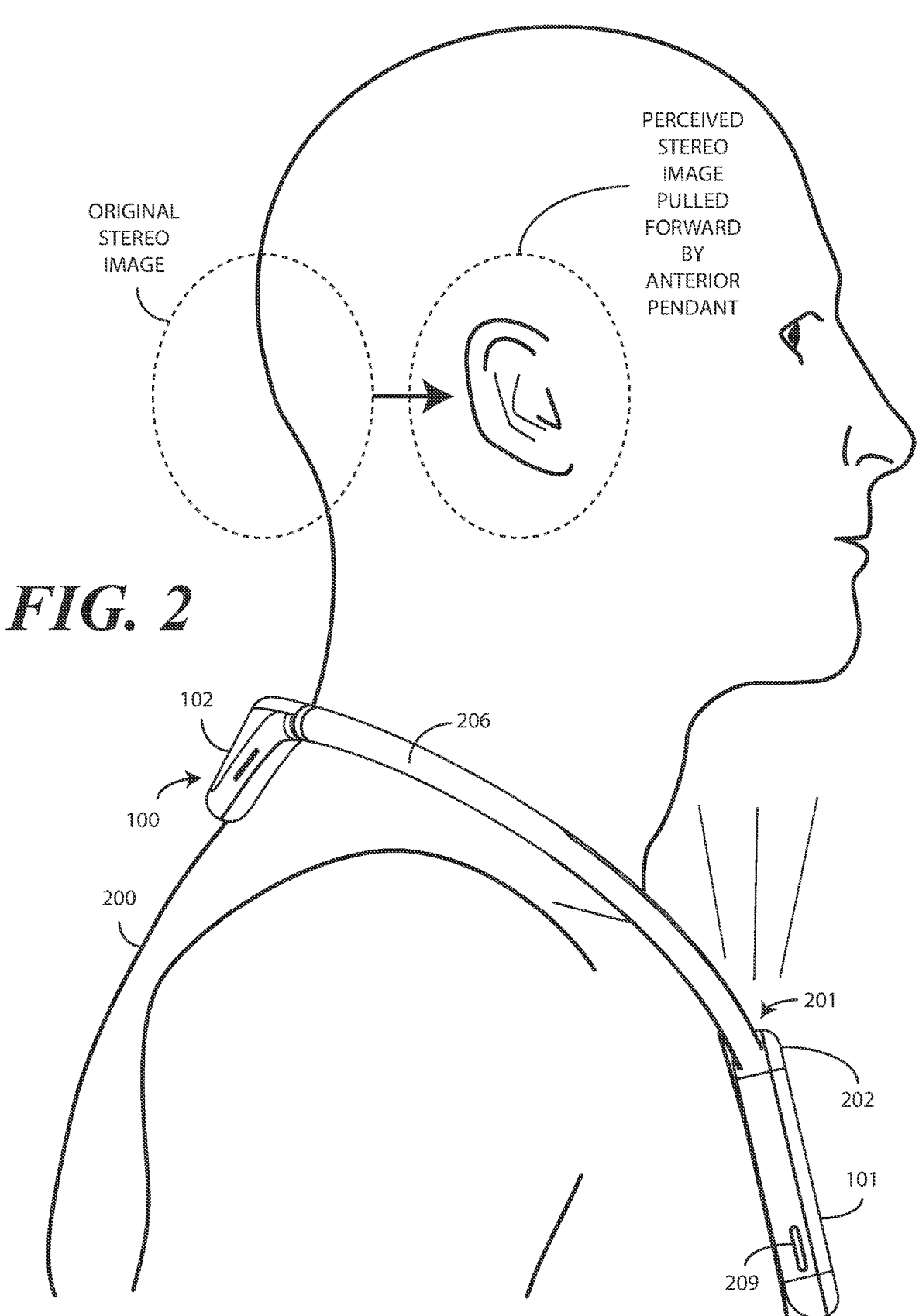
FIG. 2 illustrates a side elevation view of a user wearing one explanatory wearable electronic device in accordance with one or more embodiments of the disclosure.
Figure 3:
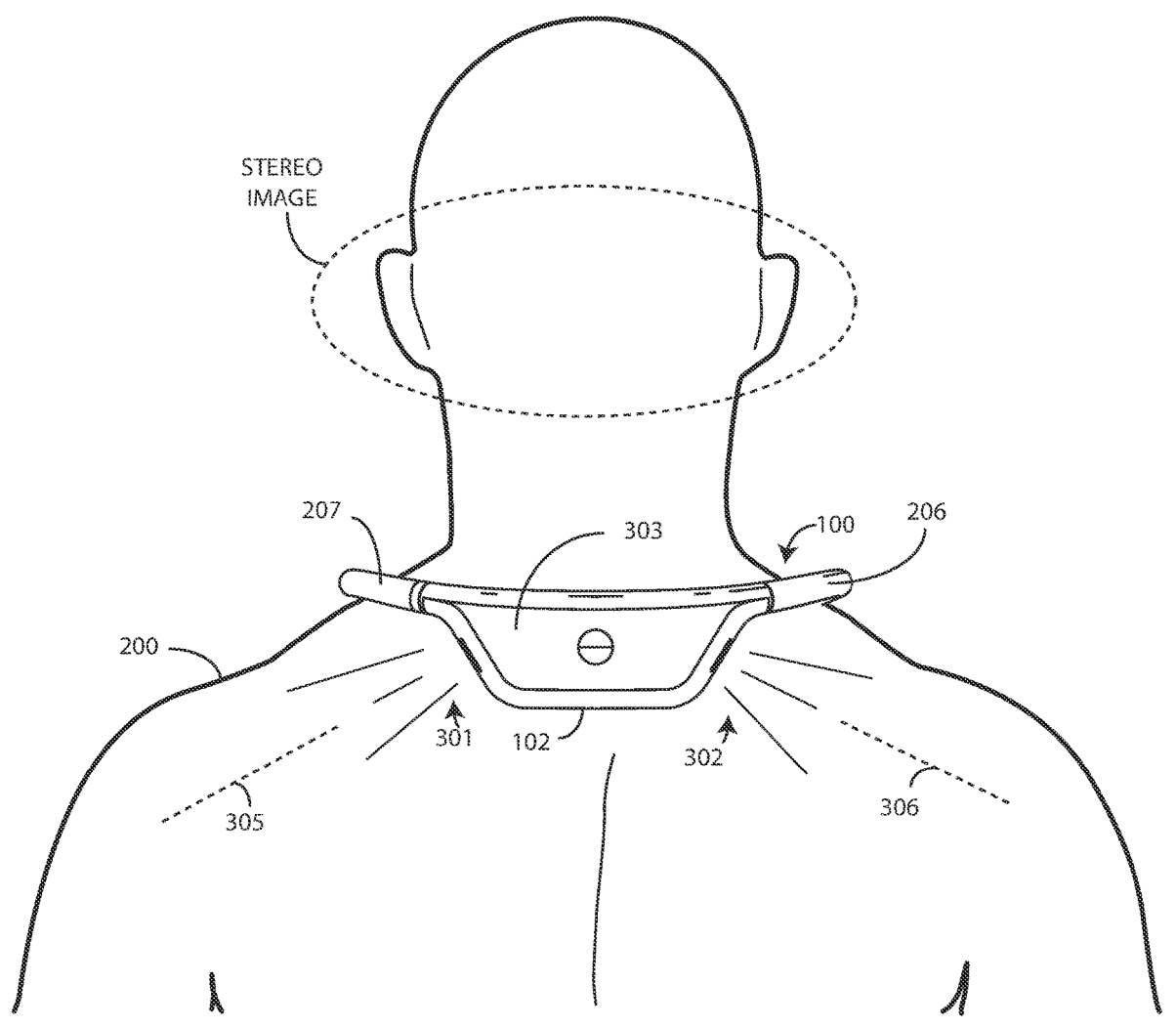
FIG. 3 illustrates a rear elevation view of the user wearing one explanatory wearable electronic device in accordance with one or more embodiments of the disclosure.

Turning now to FIGS. 2-3, illustrated therein is the explanatory electronic device 100 of FIG. 1 delivering audio output signals that combine to move the stereo image from a location closer to the posterior pendant 102 to one farther from the posterior pendant 102, closer to the anterior pendant 101, and situated vertically within a columnar boundary defined by the anterior pendant 101, the posterior pendant 102, the right neck strap 206, and the left strap 207.

As shown, the single channel anterior audio output (103) of the anterior pendant 101 delivers a combined left channel audio signal and right channel audio signal output 201 through a port 202 of the anterior pendant 101. In this illustrative embodiment, the port 202 of the anterior pendant 101 is situated along an upper surface of the anterior pendant 101. This results in the combined left channel audio signal and right channel audio signal output 201 being directed toward a cranial side of the wearable electronic device 100.

The posterior pendant 102 comprises an upper edge, a lower edge, a first side edge, and a second side edge. In one or more embodiments, the first side edge and the second side edge taper inward as they extend from the upper edge to the lower edge. In so doing, the upper edge, which defines a first end of the posterior pendant 102, the lower edge, which defines a base of the posterior pendant 102, define a caudally facing (when the wearable electronic device 100 is worn as shown in FIGS. 2-3) frustoconical posterior pendant major surface. As used herein, "frustoconical" takes its ordinary meaning of the shape of a frustum or cone with its pointed end cut off by a plane running substantially parallel to its base. In this vein, the caudally facing frustoconical posterior pendant major surface is wider at the top than at the bottom with the upper edge being oriented substantially parallel with the lower edge, and with the first side edge and second side edge tapering inward as they extend downward (caudally) from the upper edge.

In one or more embodiments, the first port of the posterior pendant 102 is situated on the first side edge, while the second port of the posterior pendant 102 is situated on the second side edge. This arrangement, counterintuitively, causes the left channel audio signal output 301 and the right channel audio signal output 302 to be directed downward, i.e., toward a caudal side of the wearable electronic device 100 and away from each other. This orientation results in central axes 305,306 of the first port of the posterior pendant 102 and the second port of the posterior pendant 102, which pass from an interior of the posterior pendant 102 to an exterior of the posterior pendant 102, extending downward from the upper edge of the posterior pendant 102 and away from each other. Thus, the left channel audio signal output 301 is delivered downward and away from both the posterior pendant 102 and the right channel audio signal output 302, while the right channel audio signal output 302 is delivered downward and away from both the posterior pendant 102 and the left channel audio signal output 301.

While perhaps initially counterintuitive, delivering the left channel audio signal output 301 and right channel audio signal output 302 downward and away from the posterior pendant 102 at roughly forty-five degree angles maximizes the aural separation of each channel, thereby improving the robustness and richness of the stereo image resulting from the combination of the combined left channel audio signal output and right channel audio signal output 201 from the port 202 in the anterior pendant 101 and the left channel audio signal output 301 and the right channel audio signal output 302 from the first port and second port of the posterior pendant 102.

In one or more embodiments when the wearable electronic device 100 is worn, the anterior pendant 101 is farther from the user's ears than is the posterior pendant 102. Consequently, the port 202 of the anterior pendant 101 is farther from the user's ears than either the first port of the posterior pendant 102 or the second port of the posterior pendant 102. Accordingly, it takes more time for the combined left channel audio signal and right channel audio signal output 201 to reach the user's ears than either the left channel audio signal output 301 or right channel audio signal output 302.

To compensate, in one or more embodiments one or more processors (110) of the wearable electronic device 100 insert a predefined delay between the combined left channel audio signal and right channel audio signal output 302 emanating from the single channel anterior audio output (103) and each of the left channel audio signal output 301 and right channel audio signal output 302 emanating from the first single channel posterior audio output (104) and the second single channel posterior audio output (105), respectively. Since sound travels at eleven hundred feet per second, which is roughly one millisecond per foot, in one or more embodiments the predefined delay is about one millisecond. Embodiments of the disclosure contemplate that delays over three milliseconds will affect the desirability of the stereo image. Accordingly, in one or more embodiments the predefined delay is less than three milliseconds. As previously described, the predefined delay can be user definable in one or more embodiments.

As shown, a user 200 wearing a wearable electronic device 100. As previously described, the wearable electronic device 100 includes an anterior pendant 101 and a posterior pendant 102. In this illustrative embodiment the anterior pendant 101 is generally rectangular in shape and situates at the anterior portion of the user's torso by sitting flush against the user's chest with the first port 202 of the anterior pendant 101 situating beneath the user's chin in front of the user's ears. The posterior pendant 102 takes the shape of an inverted frustoconical quadrilateral and situates on the posterior portion of the user's torso by sitting flush against the user's shoulders behind the neck and behind the user's ears.

A right shoulder strap 206 passes across the user's right shoulder and couples the right sides of the anterior pendant 101 and the posterior pendant 102 together. Likewise, a left shoulder strap 207 passes across the user's left shoulder and couples the left sides of the anterior pendant 101 and the posterior pendant 102 together. As will be shown in more detail below with reference to FIG. 6, in this illustrative embodiment each of the right shoulder strap 206 and the left shoulder strap 206 are ovular in cross section and, more particularly, have a perimeter that is a rounded rectangle or racetrack shaped. The right shoulder strap 206 and left shoulder strap 207 exit from the top of the posterior pendant 102 as extensions from the widest edge of the inverted frustoconical quadrilateral and then enter the upper corners of the rectangle defining the anterior pendant 101. An optional decoupling clasp, one example of which will be illustrated and described below with reference to FIG. 11, can be used to open the left shoulder strap 207 so that the wearable electronic device 100 need not be passed over the user's head to be donned. While positioned along the left shoulder strap 207 in one or more embodiments, the optional decoupling clasp could be placed on the right shoulder strap 206 as well.

In this illustrative embodiment, a user actuation device 209, shown as a button in FIG. 2, is placed on a minor surface of the anterior pendant 101. The user actuation device 209 can be used to turn the wearable electronic device 100 ON, turn it OFF, and to perform other control operations as well. For example, a long press of the user actuation device 209 when the wearable electronic device 100 is OFF may turn the same ON, while short presses of the user actuation device 209 while the wearable electronic device 100 is ON may perform certain control operations such as track advance, pausing, playing, and so forth. A long press of the user actuation device 209 when the wearable electronic device 100 is ON may turn the wearable electronic device 100 OFF.

The wearable electronic device 100 again includes a plurality of audio outputs. In one or more embodiments, these comprise a left channel audio signal output 301 situated at a first end of the posterior pendant 102 and a right channel audio signal output 302 situated at a second end of the posterior pendant 102. In the illustrative embodiment of FIGS. 2-3, the left channel audio signal output 301 and the right channel audio signal output 302 are separated from each other by the body 303 of the posterior pendant 102. On the anterior pendant 101, a single combined left channel and right channel audio signal output 302 is situated at a cranial edge of the anterior pendant 101.

As shown in FIG. 3, the first end of the posterior pendant 102, the base of the posterior pendant 102, and the second end of the posterior pendant define a caudally facing frustoconical posterior pendant major surface. This results in central axes 305,306 of the left channel audio signal output 301 and the right channel audio signal output 302 being directed downward and away from the user's ears.

Turning now to FIG. 4, a simplified schematic diagram shows how the user 200 perceives audio as a centralized stereo image 108 from the various outputs shown in FIGS. 2-3. A left channel audio signal output 301 is delivered from a first side of the posterior pendant (102) to the user's ears. Meanwhile, a right channel audio signal output 302 is delivered from a second side of the posterior pendant (102) to the user's ears. The caudally and outwardly facing orientation of the central axes 305,306 of the left channel audio signal output 301 and the right channel audio signal output 302 results in maximum channel separation for the physical form factor of the posterior pendant (102), thereby creating a robust stereo image 108 for the user 200.

Without the anterior pendant (101), this stereo image 108 would situate above the posterior pendant (102), which would be perceived as being behind the user's head (because it is). However, by delivering a monaural audio signal output 401 combining the left channel audio signal output 301 and the right channel audio signal output 302 from the anterior pendant (101) pulls the stereo image 108 defined by the combination of the left channel audio signal output 301, the right channel audio signal output 302, and the monaural audio signal output 401 toward the anterior pendant (101), which situates the stereo image 108 at the user's ears as shown in FIG. 4.

Turning now to FIG. 5, illustrated therein are one or more method steps for constructing portions of a cable assembly in accordance with one or more embodiments of the disclosure. Recall from above that in one or more embodiments the cable assembly comprises a pressure sensitive adhesive layer separating a first plurality of cables from a second plurality of cables with each cable of the first plurality of cables abutting a first major surface of the pressure sensitive adhesive layer and each cable of the second plurality of cables abutting a second major surface of the pressure sensitive adhesive layer. At least one wrap of conductive tape encircles the first plurality of cables, the second plurality of cables, and the pressure sensitive adhesive layer. The method steps of FIG. 5 approach this construction from the outside in.

To wit, at step 501 the at least one wrap of conductive tape comprises a plurality of wraps 505 of conductive tape. Each has been placed atop a template 506 an assembler can use to properly assemble the cable assembly. In this illustrative embodiment, each wrap of conductive tape of the plurality of wraps 505 of conductive tape comprises a wrap of Teflon.sup.™ tape.

In this illustrative embodiment, each wrap of conductive tape of the plurality of wraps 505 of conductive tape is separated from at least one other wrap if conductive tape of the plurality of wraps of conductive tape by a predefined distance 510. In one or more embodiments, the predefined distance 510 is less than forty millimeters.

In other embodiments, the at least one wrap of conductive tape can be a single wrap of conductive tape. However, testing has shown that when the at least one wrap is configured as a plurality of wraps 505 of conductive tape separated by the predefined distance 510, especially when the plurality of wraps 505 of conductive tape are wraps of Teflon.sup.™ tape, noise is reduced. When using a single wrap of conductive tape, bending of the neck strap into which the resulting cable assembly will be positioned can cause a crinkling and wrinkling noise. By configuring the at least one wrap of conductive tape as the plurality of wraps 505 of Teflon.sup.™ tape, this noise is reduced.

As shown at step 501, the plurality of wraps 505 of conductive tape are evenly spaced and are slightly off-center with a central axis of the template 506 being positioned lower that medial axes of the plurality of wraps 505 of conductive tape. However, with the exception of the end portion of the template 506 that curves, the major axis of the template 506 and the medial axes of the plurality of wraps 505 of conductive tape are substantially parallel.

At step 502, the pressure sensitive adhesive layer 507 has been placed atop the plurality of wraps 505 of conductive tape. At step 503, the first plurality of cables 508 is positioned atop the plurality of wraps 505 of conductive tape adjacent to the pressure sensitive adhesive layer 507. The first plurality of cables 508 is then stacked on the pressure sensitive adhesive layer 507. Some of each wrap of the plurality of wraps 505 of conductive tape is then wrapped atop the first plurality of cables 508.

At step 504, the second plurality of cables 509 is placed on the opposite side of the pressure sensitive adhesive layer 507 such that each cable of the first plurality of cables 508 abuts a first major surface of the pressure sensitive adhesive layer 507 while each cable of the second plurality of cables 509 abuts a second major surface of the pressure sensitive adhesive layer 507. The remainder of each wrap of the plurality of wraps 505 of conductive tape can then be wrapped around the second plurality of cables 509. A cushion layer and other components can be added at step 504 as well.

Figure 6:
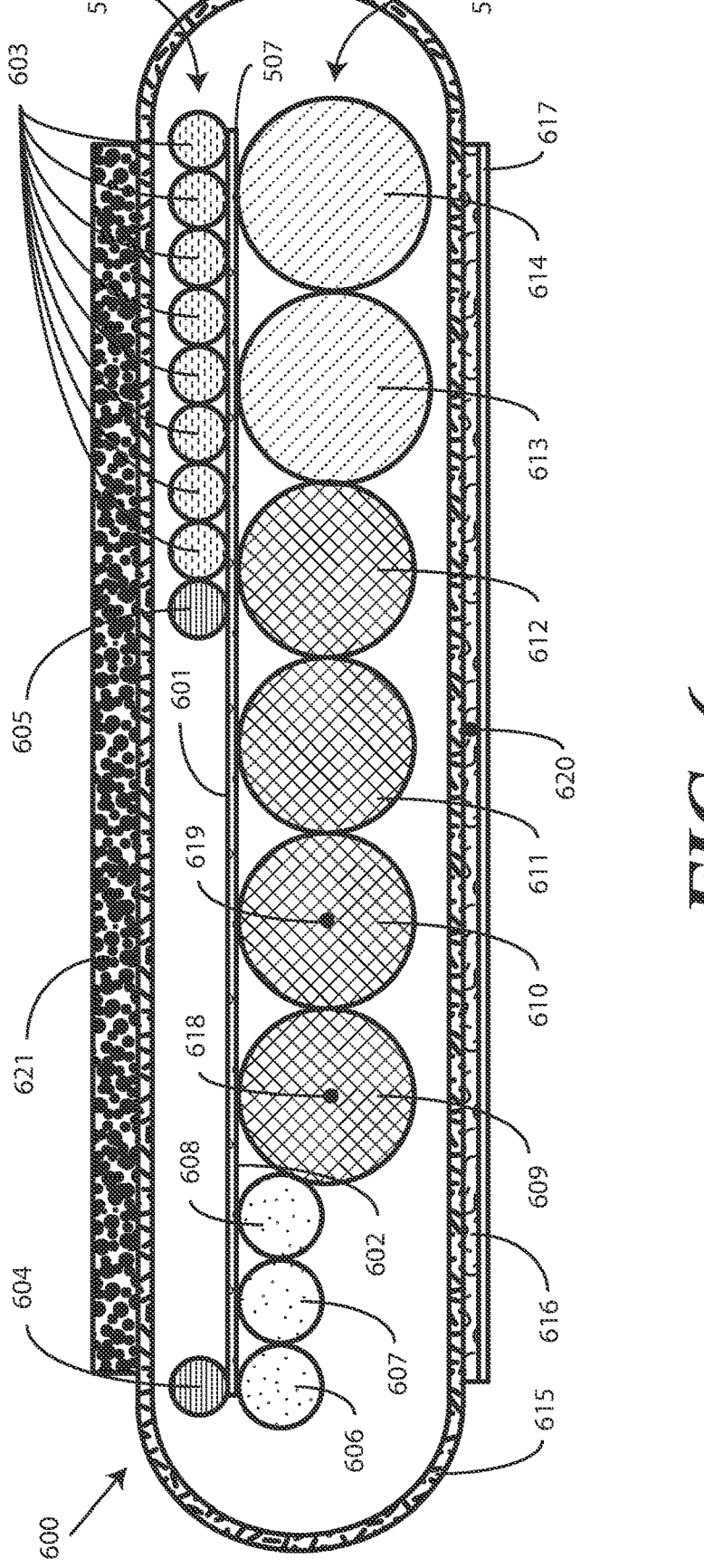
FIG. 6 illustrates a sectional view of one explanatory cable assembly in accordance with one or more embodiments of the disclosure.

One result of the one or more method steps of FIG. 5 is shown in FIG. 6. Turning now to FIG. 6, illustrated therein is a cross section of one explanatory cable assembly 600 configured in accordance with one or more embodiments of the disclosure.

In one or more embodiments, the cable assembly 600 comprises the first plurality of cables 508 and the second plurality of cables 509. Positioned between the first plurality of cables and the second plurality of cables 509 is the pressure sensitive adhesive layer 507. In this illustrative embodiment, each cable of the first plurality of cables 508 abuts a first major surface 601 of the pressure sensitive adhesive layer 507, while each cable of the second plurality of cables 509 abuts a second major surface 602 of the pressure sensitive adhesive layer 507.

As shown in FIG. 6, this results in each cable of the first plurality of cables 508 being arranged in a single-layer row across the first major surface 601 of the pressure sensitive adhesive layer 507. Moreover, each central axis of each cable of the first plurality of cables 508 is arranged in a line. Similarly, each cable of the second plurality of cables 509 is arranged in a single-layer row across the second major surface 602 of the pressure sensitive adhesive layer 507. However, since the diameters of some cables of the second plurality of cables 509 are smaller than diameters of other cables of the second plurality of cables 509, the central axes of the smaller cables is arranged in a first line that is closer to the second major surface 602 of the pressure sensitive adhesive layer 507 than the central axes of the larger cables, which are also arranged in a second line that is farther from the second major surface 602 of the pressure sensitive adhesive layer 507 than the first line defined by the central axes of the smaller cables.

In this illustrative embodiment, each cable of the first plurality of cables 508 has a smaller diameter than each cable of the second plurality of cables 509. However, as noted in the preceding paragraph, some cables of the second plurality of cables 509 and some other cables of the second plurality of cables 509 have different diameters.

In this illustrative embodiment, for the wearable electronic device application described above with reference to FIGS. 1-4, eight cables 603 of the first plurality of cables 508 each comprise micro-coaxial (MCX) radio frequency cables having an American Wire Gauge (AWG) gauge of 40 and a diameter of 0.38 millimeters. Other cables 604,605 of the first plurality of cables 508 comprise discrete data cable having an AWG gauge of 34 and a diameter of 0.36 millimeters.

On the other side of the pressure sensitive adhesive layer 507, cables 606, 607, 608 each comprise radio frequency coaxial cables having an AWG gauge of 36 and a diameter of 0.55 millimeters. Cables 609, 610 are millimeter-wave antenna cables having an AWG gauge of 32 and a diameter of 1.13 millimeters. Cable 611 is a power supply line (Vbus) for a head mounted display that can be coupled to the wearable electronic device of FIGS. 1-4 using a connector port. This cable 611 has an AWG gauge of 24 and a diameter of 1.135 millimeters. Meanwhile, cable 612 comprises a power supply line for charging rechargeable electronic batteries situated in the anterior pendant or posterior pendant and has an AWG gauge of 24 and a diameter of 1.135 millimeters.

Cables 613, 614 are battery negative and battery positive lines, respectively, and each have an AWG gauge of 22 and a diameter of 1.26 millimeters. These examples of cable functions and sizes are illustrative only, as other combinations of cables will be used in applications other than for the wearable electronic device of FIGS. 1-4.

In one or more embodiments, at least one wrap 615 of conductive tape encircles the first plurality of cables 508, the second plurality of cables 509, and the pressure sensitive adhesive layer 507. A conductive tape layer 616 is positioned on an exterior surface of the at least one wrap 615 of conductive tape. In this illustrative embodiment, the conductive tape layer 616 comprises a double-sided adhesive layer of conductive tape. Accordingly, one side of the double-sided adhesive layer is attached to the exterior surface of the at least one wrap 615 of conductive tape. Meanwhile, a peelable cover layer 617 is attached to the other side of the double-sided adhesive layer of conductive tape. This peelable cover layer 617 can be removed to stick the cable assembly 600 to another cable assembly component, as will be described in more detail below.

In the illustrative embodiment of FIG. 6, major axes of each cable, examples of which include major axis 618 of cable 609 and major axis 619 of cable 610, of the first plurality of cables 508 of the second plurality of cables 509 are substantially parallel. Similarly, a central axis 620 of the conductive tape layer 616 is also substantially parallel with major axes of each cable of the first plurality of cables 508 and each cable of the second plurality of cables 509 as well.

In one or more embodiments, a cushion layer 621 is positioned on the exterior surface of the at least one wrap 615 of conductive tape. In one or more embodiments, the cushion layer 621 is a compressible foam, compressible rubber, compressible silicone, or other cushioning material. Here the cushion layer 621 and the conductive tape layer 616 are positioned on opposite sides of the at least one wrap 615 of conductive tape. Moreover, major axes of the cushion layer 621 and the at least one wrap 615 of conductive tape, each oriented into the page as viewed in FIG. 6, are oriented substantially parallel as well.

Figure 7:
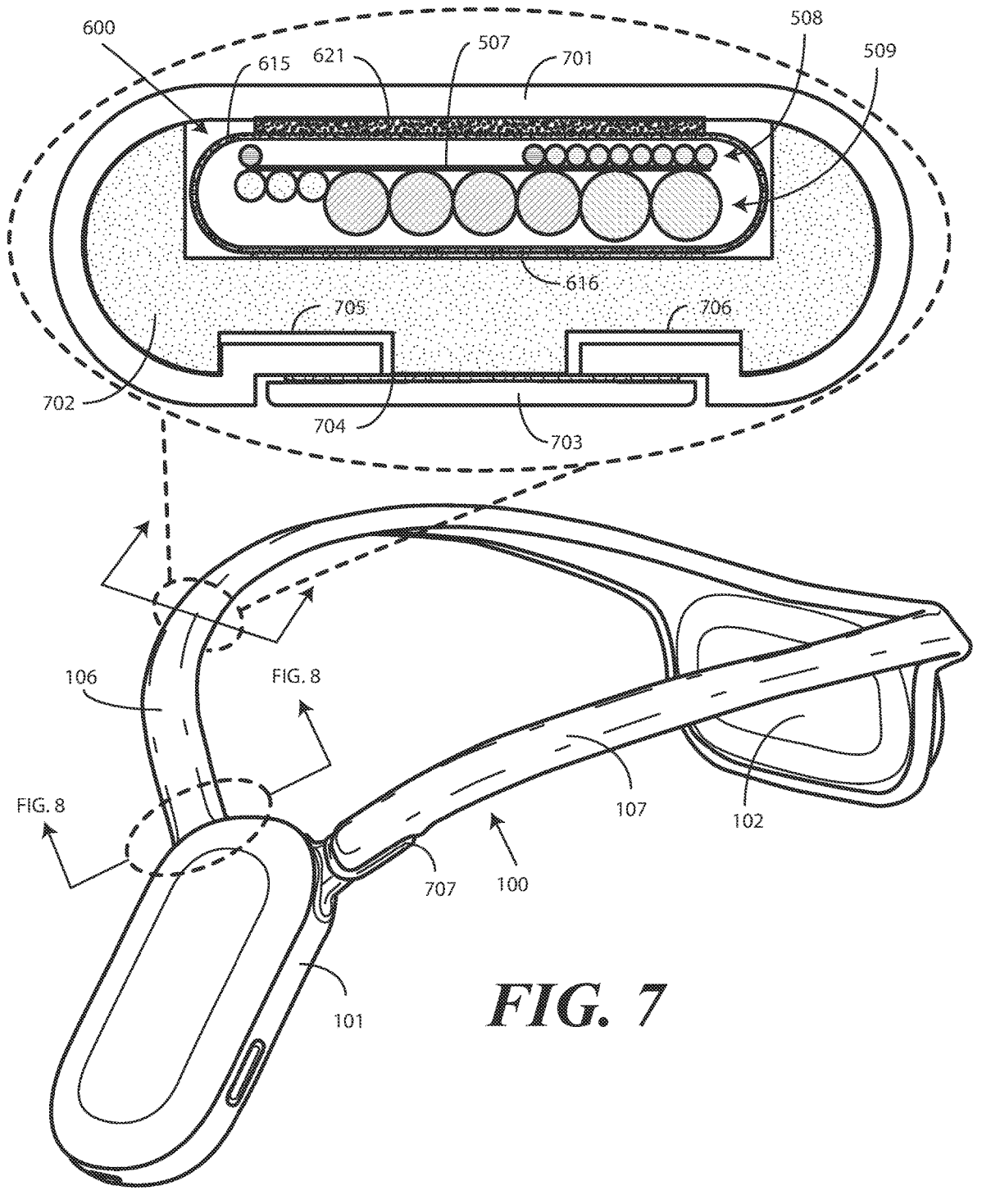
FIG. 7 illustrates a sectional view of one explanatory cable assembly incorporated into one explanatory wearable electronic device in accordance with one or more embodiments of the disclosure.

Turning now to FIG. 7, illustrated therein is the cable assembly 600 of FIG. 6 when integrated into a wearable electronic device 100. In this illustrative embodiment, the cable assembly 600 has been incorporated into a neck strap 106 of the wearable electronic device 100. A fabric sheath 701 envelops the cable assembly 600, with the cushion layer 621 abutting an interior surface of the fabric sheath 701.

In one or more embodiments, the fabric sheath 701 is attached to the cable assembly 600 and the cable assembly carrier 702 by a hot melt adhesive. In one or more embodiments, the fabric sheath 701 is manufactured from a hydrophobic material so that water cannot enter the neck strap 106 from directions normal to the exterior surfaces of the fabric sheath 701.

Embodiments of the disclosure contemplate that when the cable assembly 600 is integrated into a neck strap for a wearable electronic device 100, flexing and bending can cause the fabric sheath 701 to wrinkle, bunch, and gather. In one or more embodiments, a hot melt adhesive is cut to shame and situated between the fabric sheath 701 and the cushion layer 621, and between the fabric sheath 701 and the cable assembly carrier 702. Thereafter, the assembly is cured with a fixture that applies heat and a compressive force to the fabric sheath 701 to activate this hot melt adhesive so the fabric can adhere to the cushion layer 621 and the cable assembly carrier 702. In one or more embodiments, the hot melt adhesive has adequate shearing properties to allow the fabric sheath 701 to move with the bending of the neck strap 106, but without showing wrinkles. Moreover, the hot melt adhesive prevents the fabric sheath 701 from delaminating from the cable assembly carrier 702.

A cable assembly carrier 702 is also situated between the cable assembly 600 and the fabric sheath 701. The conductive tape layer 616, being configured as a double-sided adhesive layer of conductive tape, affixes the cable assembly 600 to the cable assembly carrier 702 when the peelable layer (617) is removed.

In one or more embodiments, the cable assembly carrier 702 is manufactured from a thermoplastic elastomer so that it can bend and flex without cracking. Illustrating by example, in one or more embodiments the cable assembly carrier 702 is manufactured from silicone. Other suitable materials for the cable assembly carrier 702 will be obvious to those of ordinary skill in the art having the benefit of this disclosure. In one or more embodiments, polycarbonate can be integrated into the thermoplastic elastomer to increase its rigidity.

In one or more embodiments, the cable assembly carrier is manufactured with two peninsular recesses 705, 706 into which ends of the fabric sheath 701 can situate. Thereafter, a band 703 can attach to each end of the fabric sheath 701 with another pressure sensitive adhesive layer 704 to seal the ends of the fabric sheath 701. The band 703 can be manufactured from a thermoplastic material such as silicone, from fabric, or from other flexible materials.

When the cable assembly 600 of FIG. 6, with its pressure sensitive adhesive layer 507 separating a first plurality of cables 508 from a second plurality of cables 509 with each cable of the first plurality of cables 508 abutting a first major surface of the pressure sensitive adhesive layer 507 and each gable of the second plurality of cables 509 abutting a second major surface of the pressure sensitive adhesive layer 507, with at least one wrap 615 of conductive tape encircling the first plurality of cables 508, the second plurality of cables 509, and the pressure sensitive adhesive layer 507, a conductive tape layer 616 positioned on an exterior surface of the at least one wrap 615 of conductive tape, and the cushion layer 621 positioned on the exterior surface of the at least one wrap 615 of conductive tape, the resulting assembly defines a wrapped cable structure. As shown in FIG. 7, the wrapped cable structure has a fabric sheath 701 enshrouding it, with a cable assembly carrier 702 situated between the wrapped cable structure and the fabric sheath 701, which can be manufactured from a layer of fabric. The conductive tape layer 616 of this embodiment comprises a double-sided adhesive tape coupling the wrapped cable structure to the cable assembly carrier 702, while the cushion layer 621 abuts the interior surface of the fabric sheath 701.

In this illustrative embodiment, the neck strap 106 defined by the resulting assembly couples the anterior pendant 101 of the wearable electronic device 100 to the posterior pendant 102 of the wearable electronic device 100. As previously described, electronic components such as a monaural loudspeaker and corresponding control circuitry are situated in the anterior pendant 101, while other electronic components such as stereo speakers and corresponding control circuitry are situated in the posterior pendant 102. Said differently, the anterior pendant 101 encloses some electronics of the wearable electronic device 100 while the posterior pendant 102 encloses other electronics of the wearable electronic device 100. These electronics were described above with reference to the block diagram schematic (109) of FIG. 1.

In one or more embodiments, the electronics situated in the anterior pendant 101 are coupled to a first end of the first plurality of cables 508 and the second plurality of cables 509. Similarly, the electronics situated in the posterior pendant 102 are coupled to a second end of the first plurality of cables 508 and the second plurality of cables 509.

It should be noted that "live" cables, i.e., cables that carry data, voltage, current, and radio frequency signals, are only needed in one of the neck straps of the wearable electronic device 100. In this illustrative embodiment, these live cables are included in the first neck strap 106. This has been done because a magnetic clasp 707 is included in the second neck strap 107. Where this is the case, embodiments of the disclosure contemplate that it can be desirable to have the pliability, weight, and other tactile characteristics of the second neck strap 107 match those of the first neck strap 106. Accordingly, in one or more embodiments the second neck strap 107 can be constructed just as the first neck strap 106 is, but with the first plurality of cables and second plurality of cables situated in the second neck strap 107 not connected to electronics. In other embodiments, the second neck strap 107 can be filled with a thermoplastic elastomer having pliability, weight, and other tactile characteristics that emulate those of the first neck strap 106. Other ways to make the second neck strap 107 "feel" like the first neck strap 106 will be obvious to those of ordinary skill in the art having the benefit of this disclosure.

Figure 8:
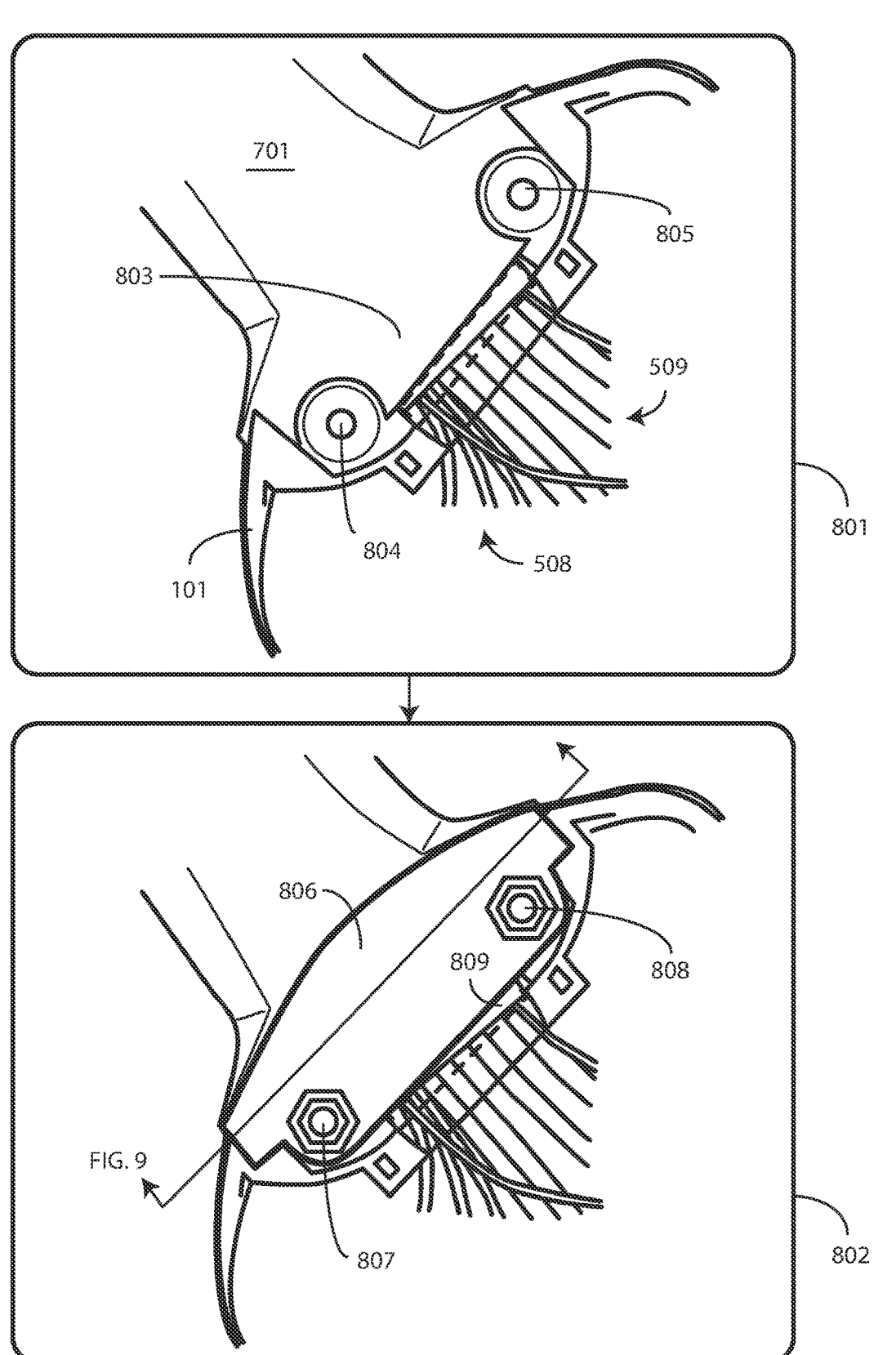
FIG. 8 illustrates one or more method steps for coupling an explanatory cable assembly to a pendant of a wearable electronic device in accordance with one or more embodiments of the disclosure.

Turning now to FIG. 8, illustrated therein are one or more method steps illustrating how these electronic connections can be made while keeping the wearable electronic device (100) waterproof. Embodiments of the disclosure contemplate that wearable products worn at the neck, one example of which is wearable electronic device (100), should have some level of water resistance to ensure that any sweat or water will not damage the product. The one or more method steps of FIG. 8 minimize the occurrence of water intrusion and damage. While the method steps of FIG. 8 show the cable assembly of FIG. 7 being coupled to the anterior pendant 101, similar techniques can be used to couple the cable assembly to the posterior pendant (102) as well.

Beginning at step 801, an end 803 of the cable assembly has been positioned atop a receiver of the anterior pendant 101. The fabric sheath 701 and components therein have been flattened between two screw bosses 804, 805. The first plurality of cables 508 and the second plurality of cables 509 extend distally from the end 803 of the cable assembly so as to connect to electronic components situated within the anterior pendant 101.

At step 802, a cover member 806, which can be manufactured from a rigid thermoplastic such as polycarbonate, ABS, polycarbonate-ABS, or other similar materials, is then positioned atop the end 803 of the cable assembly. Screws 807, 808 can then be screwed into the screw bosses 804, 805 to compress the cover member 806 against the end 803 of the cable assembly to retain it in place. In one or more embodiments, gaskets are positioned under the screws 807, 808 to ensure that water cannot enter from the rear side of the anterior pendant 101.

Once the cover member 806 is positioned atop the end 803 of the cable assembly, the first plurality of cables 508 and the second plurality of cables 509 can be over molded with plastic 809 (or filled with epoxy) as they exit the end 803 of the cable assembly. In one or more embodiments, this over molded plastic or injected epoxy precludes any water that may be in the cable assembly from entering the anterior pendant 101. The other half of the anterior pendant 101 can then be positioned atop this engagement.

Figure 9:
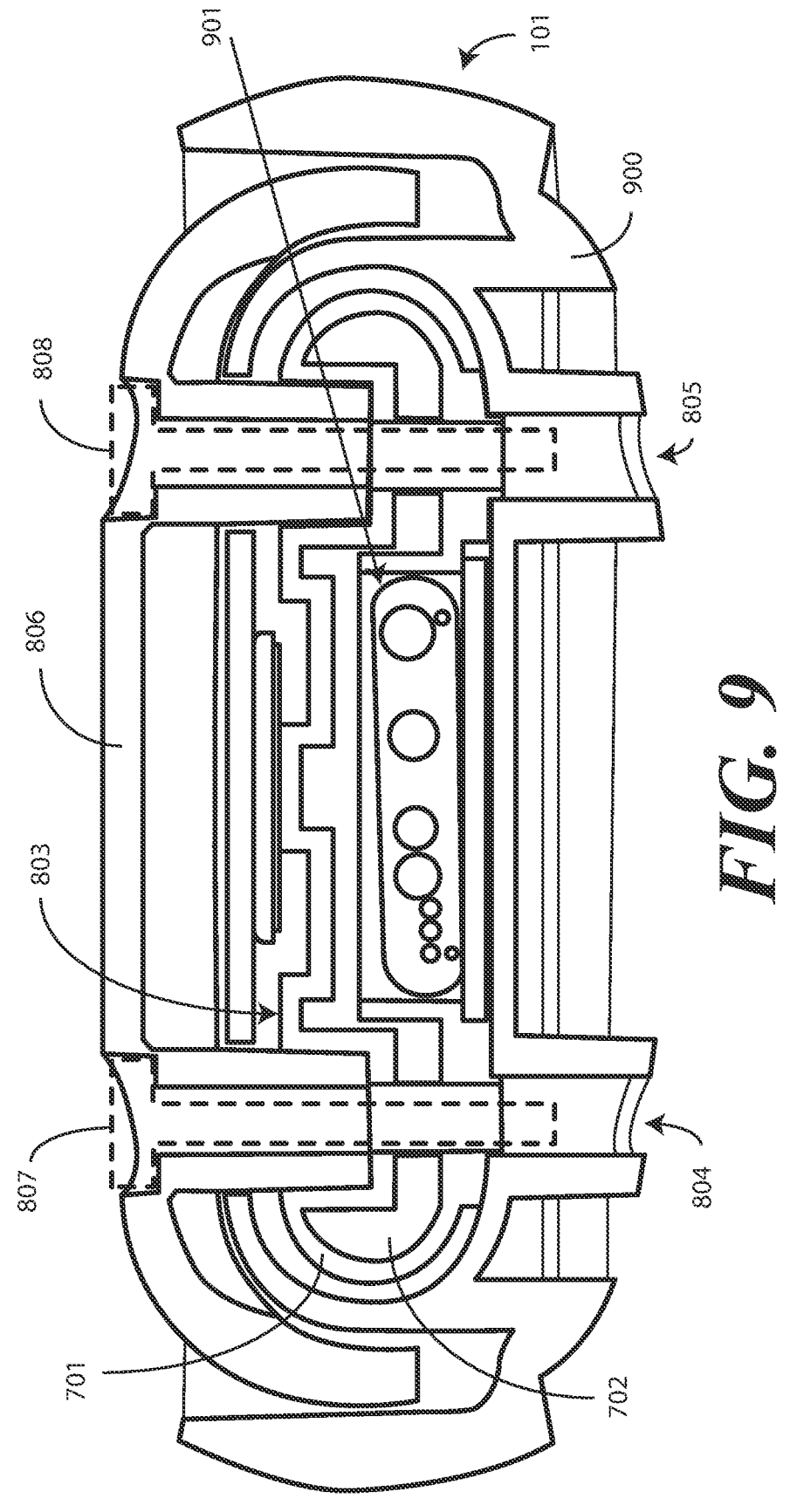
FIG. 9 illustrates a sectional view of one explanatory cable assembly when connected to a pendant of a wearable electronic device in accordance with one or more embodiments of the disclosure.

To better see each layer and how it acts when the cover member 806 is positioned atop the end 803 of the cable assembly, a cross section is shown in FIG. 9. Turning now to FIG. 9, illustrated therein is the result of step (802) of FIG. 8.

As shown, the end 803 of the cable assembly is positioned against a housing 900 of the anterior pendant 101. The cover member 806 is then situated atop the end 803 of the cable assembly. Screws 807, 808 then engage the screw bosses 804, 805 to compress portions of the cable assembly around the wrapped cable structure 901 described above with reference to FIG. 8. This causes the cable assembly carrier 702 to compress on either side of the wrapped cable structure 901. The fabric sheath 701 also compresses and conforms to the shape of the cover member 806 as well.

Figures 10, 11:
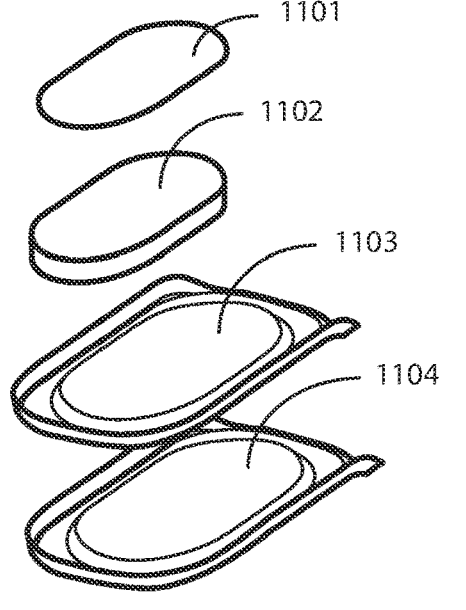
FIG. 10 illustrates an exploded view of portions of one explanatory wearable electronic device in accordance with one or more embodiments of the disclosure.
FIG. 11 illustrates an exploded view of one explanatory latch in accordance with one or more embodiments of the disclosure.

Turning now to FIG. 10, illustrated therein is an exploded view of one explanatory wearable electronic device assembly in accordance with one or more embodiments of the disclosure. Each of the components shown in FIG. 10 have been previously described, so another detailed explanation here is not required. However, FIG. 10 provides another view of some of these components that is in contrast to the sectional views previously described. The components shown in FIG. 10 include the fabric sheath 701, the cover member 806, the cable assembly 600, the cable assembly carrier 702, the pressure sensitive adhesive layer 704, and the band 703. The magnetic latch 707 has been integrated into the cable assembly carrier 702.

Turning now to FIG. 11, illustrated therein is an exploded view of this magnetic latch 707. Its components include a pressure sensitive adhesive layer 1101, a magnet 1102, an adhesive layer 1103, and a decorative metal cover 1104. In one or more embodiments, the pressure sensitive adhesive layer 1101 couples these components to the cable assembly carrier (702), as shown in FIG. 10.

Figure 12:
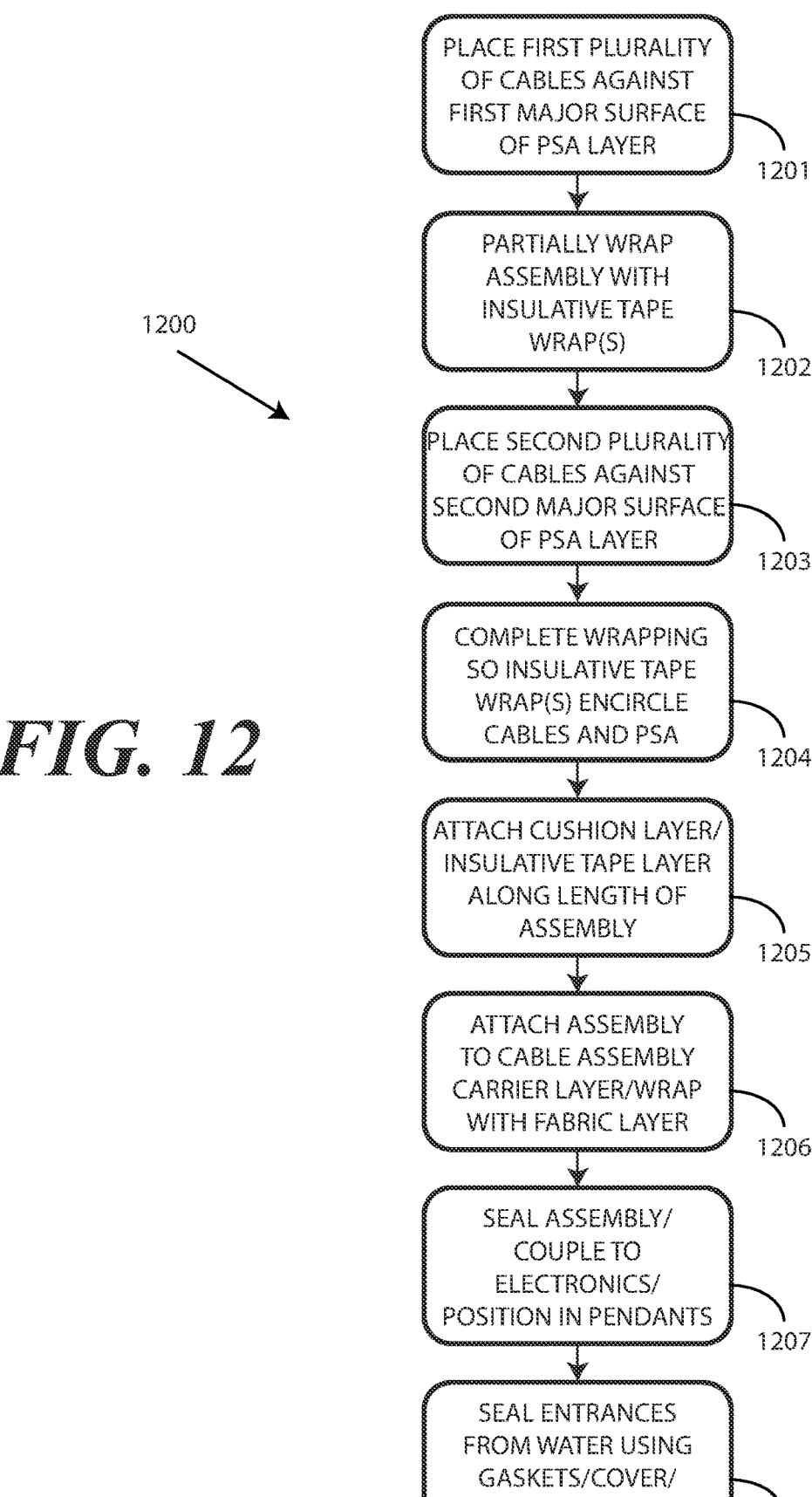
FIG. 12 illustrates another explanatory method in accordance with one or more embodiments of the disclosure.

Turning now to FIG. 12, illustrated therein is one explanatory method 1200 for manufacturing a cable assembly for a wearable electronic device in accordance with one or more embodiments of the disclosure. Beginning at step 1201, the method 1200 comprises placing a first plurality of cables against a first major surface of a pressure sensitive adhesive layer. Step 1202 then comprises partially wrapping the first plurality of cables and the pressure sensitive adhesive layer with at least one wrap of conductive tape.

Step 1203 then comprises placing a second plurality of cables against a second major surface of the pressure sensitive adhesive layer. Step 1204 then completes the partially wrapping of the at least one wrap of conductive tape such that the at least one wrap of conductive tape encircles the first plurality of cables, the second plurality of cables, and the pressure sensitive adhesive layer.

Step 1205 then comprises attaching a conductive tape layer to an exterior surface of the at least one wrap of conductive tape such that major axes of the conductive tape layer and the pressure sensitive adhesive layer are collaterally aligned. In one or more embodiments, step 1205 also comprises attaching a cushion layer to the exterior surface of the at least one wrap of conductive tape such that the cushion layer and the conductive tape layer are situated on opposite sides of the at least one wrap of conductive tape and the cushion layer, the conductive tape layer, the first plurality of cables, and the second plurality of cables are all collaterally aligned.

Step 1206 then comprises the cable assembly from step 1206 to a cable assembly carrier and wrapping the cable assembly carrier and cable assembly with a layer of fabric. Step 1207 comprises attaching a first end of the first plurality of cables and the second plurality of cables to electronic situated in an anterior pendant of a wearable electronic device and attaching a second end of the first plurality of cables and the second plurality of cables to other electronics situated in a posterior pendant of the wearable electronic device. Step 1208 can then comprise sealing the assembly as described above with reference to FIG. 8 to retain the cable assembly to the anterior pendant and posterior pendant and to prevent water ingress.

Figure 13:
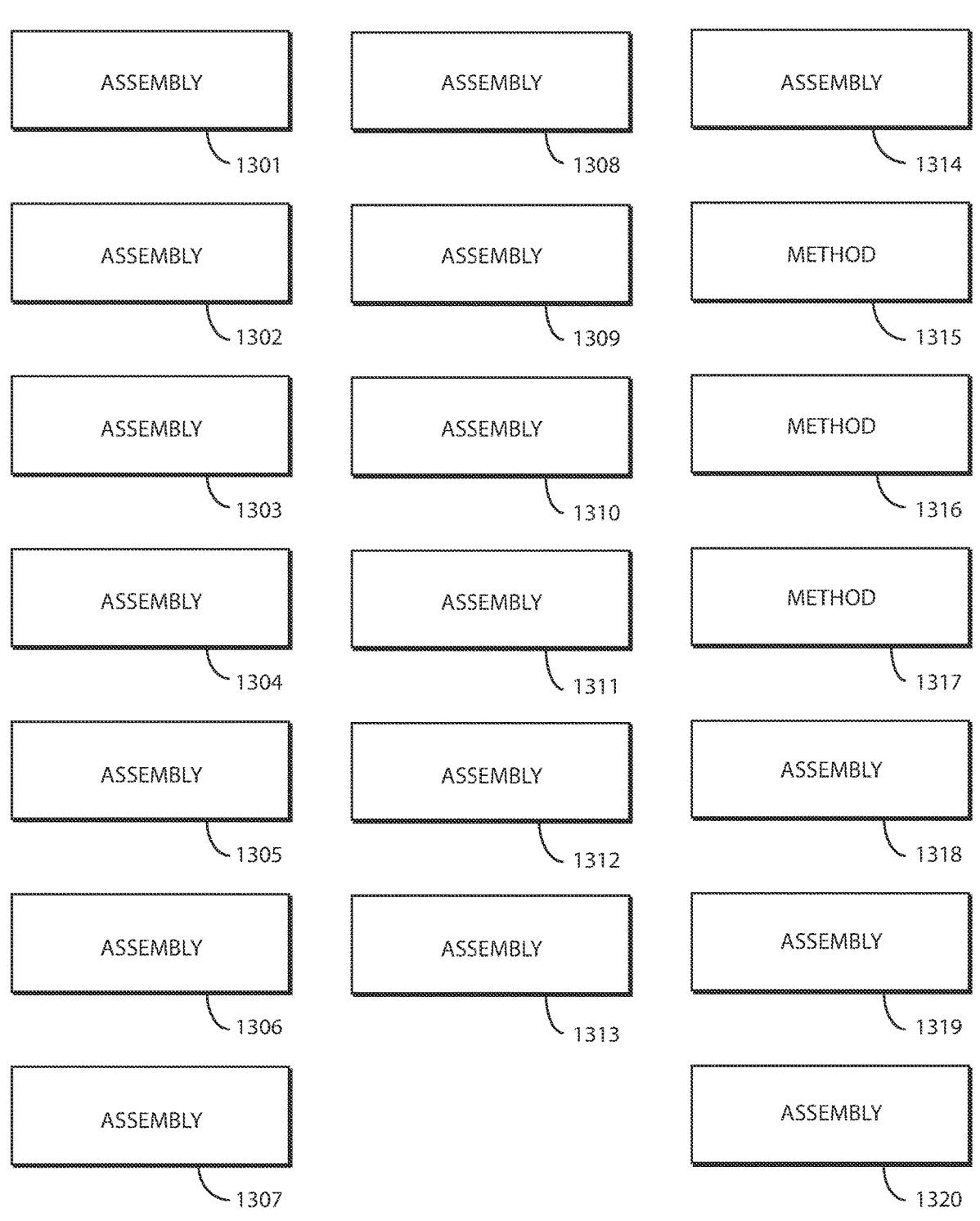
FIG. 13 illustrates various embodiments of the disclosure.

Turning now to FIG. 13, illustrated therein are various embodiments of the disclosure. The embodiments of FIG. 13 are shown as labeled boxes in FIG. 13 due to the fact that the individual components of these embodiments have been illustrated in detail in FIGS. 1-12, which precede FIG. 13. Accordingly, since these items have previously been illustrated and described, their repeated illustration is no longer essential for a proper understanding of these embodiments. Thus, the embodiments are shown as labeled boxes.

At 1301, a cable assembly for a wearable electronic device comprises a pressure sensitive adhesive layer separating a first plurality of cables from a second plurality of cables with each cable of the first plurality of cables abutting a first major surface of the pressure sensitive adhesive layer and each cable of the second plurality of cables abutting a second major surface of the pressure sensitive adhesive layer. At 1301, the cable assembly comprises at least one wrap of conductive tape encircling the first plurality of cables, the second plurality of cables, and the pressure sensitive adhesive layer. At 1301, the cable assembly comprises a conductive tape layer positioned on an exterior surface of the at least one wrap of conductive tape.

At 1302, major axes of each cable of the first plurality of cables of 1301, each cable of the second plurality of cables, and the conductive tape layer are substantially parallel. At 1303, the cable assembly of 1301 further comprises a cushion layer positioned on the exterior surface of the at least one wrap of conductive tape.

At 1304, the cushion layer of 1303 and the conductive tape layer are positioned on opposite sides of the at least one wrap of conductive tape. At 1305, major axes of the conductive tape layer of 1304 and the cushion layer are substantially parallel.

At 1306, the at least one wrap of conductive tape of 1303 comprises a plurality of wraps of conductive tape. At 1306, each wrap of conductive tape of the plurality of wraps of conductive tape is separated from at least one other wrap of conductive tape of the plurality of wraps of conductive tape by a predefined distance. At 1307, the predefined distance of 1306 is less than forty millimeters.

At 1308, each wrap of conductive tape of 1306 comprises a wrap of Teflon.sup.™ (polytetrafluoroethylene) tape. At 1309, the conductive tape layer of 1303 comprises a double-sided adhesive layer of conductive tape.

At 1310, each cable of the first plurality of cables of 1301 has a smaller diameter than each cable of the second plurality of cables. At 1311, some cables of the second plurality of cables of 131 and some other cables of the second plurality of cables have different diameters.

At 1312, the cable assembly of 1301 further comprises a fabric sheath enveloping the cable assembly. At 1313, the cable assembly of 1312 further comprises a cable assembly carrier situated between the cable assembly and the fabric sheath. At 1314, the cable assembly carrier of 1313 comprises a thermoplastic elastomer.

At 1315, a method of constructing a cable assembly comprises placing a first plurality of cables against a first major surface of a pressure sensitive adhesive layer and partially wrapping the first plurality of cables and the pressure sensitive adhesive layer with at least one wrap of conductive tape. At 1315, the method comprises placing a second plurality of cables against a second major surface of the pressure sensitive adhesive layer and completing the partially wrapping of the at least one wrap of conductive tape such that the at least one wrap of conductive tape encircles the first plurality of cables, the second plurality of cables, and the pressure sensitive adhesive layer. At 1315, the method comprises attaching a conductive tape layer on an exterior surface of the at least one wrap of conductive tape such that major axes of the conductive tape layer and the pressure sensitive adhesive layer are collaterally aligned.

At 1316, the method of 1315 further comprises attaching a cushion layer to the exterior surface of the at least one wrap of conductive tape such that the cushion layer and the conductive tape layer are situated on opposite sides of the at least one wrap of conductive tape and the cushion layer, the conductive tape layer, the first plurality of cables, and the second plurality of cables are all collaterally aligned. At 1317, the method of 1316 further comprises attaching a first end the first plurality of cables and the second plurality of cables to electronics situated in an anterior pendant of a wearable electronic device and attaching a second end of the first plurality of cables and the second plurality of cables to other electronics situated in a posterior pendant of the wearable electronic device.

At 1318, a cable assembly comprises a wrapped cable structure comprising a pressure sensitive adhesive layer separating a first plurality of cables from a second plurality of cables with each cable of the first plurality of cables abutting a first major surface of the pressure sensitive adhesive layer and each cable of the second plurality of cables abutting a second major surface of the pressure sensitive adhesive layer. At 1318, the cable assembly comprises at least one wrap of conductive tape encircling the first plurality of cables, the second plurality of cables, and the pressure sensitive adhesive layer.

At 1318, the cable assembly comprises a conductive tape layer positioned on an exterior surface of the at least one wrap of conductive tape and a cushion layer positioned on the exterior surface of the at least one wrap of conductive tape. At 1318, the cable assembly comprises a fabric layer enshrouding the wrapped cable structure and a cable assembly carrier situated between the wrapped cable structure and the fabric layer.

At 1318, the conductive tape layer comprises a double-sided adhesive tape coupling the wrapped cable structure to the cable assembly carrier. At 1318, the cushion layer abuts an interior surface of the fabric layer.

At 1319, the cable assembly of 1318 further comprises electronics coupled to a first end of the first plurality of cables and the second plurality of cables. At 1319, the cable assembly comprises other electronics coupled to a second end of the first plurality of cables and the second plurality of cables.

At 1320, the cable assembly of 1319 further comprises an anterior pendant enclosing the electronics and a posterior pendant enclosing the other electronics. At 1320, the cable assembly defines a neck strap separating the anterior pendant and the posterior pendant.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims.

Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims. The disclosure is defined solely by the appended claims including any amendments made during the pendency of this application and all equivalents of those claims as issued.

What is claimed is:

1. A cable assembly for a wearable electronic device, the cable assembly comprising:
   a pressure sensitive adhesive layer separating a first plurality of cables from a second plurality of cables with each cable of the first plurality of cables abutting a first major surface of the pressure sensitive adhesive layer and each cable of the second plurality of cables abutting a second major surface of the pressure sensitive adhesive layer;
   at least one wrap of tape encircling the first plurality of cables, the second plurality of cables, and the pressure sensitive adhesive layer;
   a tape layer positioned on an exterior surface of the at least one wrap of tape;
   a cushion layer positioned on the exterior surface of the at least one wrap of tape; and wherein the cushion layer and the tape layer are positioned on opposite sides of the at least one wrap of tape.

2. The cable assembly of claim 1, wherein major axes of each cable of the first plurality of cables, each cable of the second plurality of cables, and the tape layer are substantially parallel.

3. The cable assembly of claim 1, further comprising a fabric layer enshrouding the cable assembly, wherein the cushion layer abuts an interior surface of the fabric layer.

4. The cable assembly of claim 1, wherein the cushion layer comprises one of a compressible foam, a compressible rubber, or a compressible silicone.

5. The cable assembly of claim 1, wherein major axes of the tape layer and the cushion layer are substantially parallel.

6. The cable assembly of claim 1, wherein the at least one wrap of tape comprises a plurality of wraps of tape, with each wrap of tape of the plurality of wraps of tape being separated from at least one other wrap of tape of the plurality of wraps of tape by a predefined distance.

7. The cable assembly of claim 6, wherein the predefined distance is less than forty millimeters.

8. The cable assembly of claim 6, wherein the each wrap of tape comprises a wrap of polytetrafluoroethylene tape.

9. The cable assembly of claim 1, wherein the conductive tape layer comprises a double-sided adhesive layer of tape.

10. The cable assembly of claim 1, wherein each cable of the first plurality of cables has a smaller diameter than each cable of the second plurality of cables.

11. The cable assembly of claim 10, wherein some cables of the second plurality of cables and some other cables of the second plurality of cables have different diameters.

12. The cable assembly of claim 1, further comprising a fabric sheath enveloping the cable assembly.

13. The cable assembly of claim 12, further comprising a cable assembly carrier situated between the cable assembly and the fabric sheath.

14. The cable assembly of claim 13, wherein the cable assembly carrier comprises a thermoplastic elastomer.

15. A method of constructing a cable assembly, the method comprising:
   placing a first plurality of cables against a first major surface of a pressure sensitive adhesive layer;
   partially wrapping the first plurality of cables and the pressure sensitive adhesive layer with at least one wrap of tape;
   placing a second plurality of cables against a second major surface of the pressure sensitive adhesive layer;
   completing the partially wrapping of the at least one wrap of tape such that the at least one wrap of tape encircles the first plurality of cables, the second plurality of cables, and the pressure sensitive adhesive layer;
   attaching a tape layer on an exterior surface of the at least one wrap of tape such that major axes of the conductive tape layer and the pressure sensitive adhesive layer are collaterally aligned;
   attaching a cushion layer to the exterior surface of the at least one wrap of tape such that the cushion layer and the tape layer are situated on opposite sides of the at least one wrap of tape.

16. The method of claim 15, wherein the attaching the cushion layer to the exterior surface of the at least one wrap of tape results in
   the cushion layer, the tape layer, the first plurality of cables, and the second plurality of cables all being collaterally aligned.

17. The method of claim 16, further comprising:

attaching a first end the first plurality of cables and the second plurality of cables to electronics situated in an anterior pendant of a wearable electronic device; and attaching a second end of the first plurality of cables and the second plurality of cables to other electronics situated in a posterior pendant of the wearable electronic device.

18. A cable assembly, comprising:

a wrapped cable structure comprising:

a pressure sensitive adhesive layer separating a first plurality of cables from a second plurality of cables with each cable of the first plurality of cables abutting a first major surface of the pressure sensitive adhesive layer and each cable of the second plurality of cables abutting a second major surface of the pressure sensitive adhesive layer;

at least one wrap of tape encircling the first plurality of cables, the second plurality of cables, and the pressure sensitive adhesive layer;

a cover tape layer positioned on an exterior surface of the at least one wrap of tape; and a cushion layer positioned on the exterior surface of the at least one wrap of tape;

a fabric layer enshrouding the wrapped cable structure; and a cable assembly carrier situated between the wrapped cable structure and the fabric layer;

wherein:

the cover tape layer comprises a double-sided adhesive tape coupling the wrapped cable structure to the cable assembly carrier; and the cushion layer abuts an interior surface of the fabric layer.

19. The cable assembly of claim 18, further comprising:

electronics coupled to a first end of the first plurality of cables and the second plurality of cables; and other electronics coupled to a second end of the first plurality of cables and the second plurality of cables.

20. The cable assembly of claim 19, further comprising:

an anterior pendant enclosing the electronics; and a posterior pendant enclosing the other electronics;

wherein the cable assembly defines a neck strap separating the anterior pendant and the posterior pendant.

21. The cable assembly of claim 1, wherein the at least one wrap to tape comprises at least one wrap of conductive tape.

\* \* \* \* \*